(12) United States Patent  (10) Patent No.: US 7,181,608 B2
Fallon et al.  (45) Date of Patent: Feb. 20, 2007

(54) SYSTEMS AND METHODS FOR ACCELERATED LOADING OF OPERATING SYSTEMS AND APPLICATION PROGRAMS

(75) Inventors: James J. Fallon, Armonk, NY (US); John Buck, Oceanside, NY (US); Paul F. Pickel, Bethpage, NY (US); Stephen J. McEerlain, New York, NY (US)

(73) Assignee: Realtime Data LLC, New York, NY (US)

( * ) Notice: Subject to any disclaimer, the term of this patent is extended or adjusted under 35 U.S.C. 154(b) by 223 days.

(21) Appl. No.: 09/776,267

(22) Filed: Feb. 2, 2001

(65) Prior Publication Data

US 2002/0069354 A1  Jun. 6, 2002

Related U.S. Application Data

(60) Provisional application No. 60/180,114, filed on Feb. 3, 2000.

(51) Int. Cl.
*G06F 9/24* (2006.01)
*G06F 9/00* (2006.01)
*G06F 13/00* (2006.01)

(52) U.S. Cl. .................... 713/2; 713/1; 711/113
(58) Field of Classification Search ............ 713/2, 713/1, 100; 711/170, 118, 113
See application file for complete search history.

(56) References Cited

U.S. PATENT DOCUMENTS 4,127,518 A  11/1978  Coy et al.
4,302,775 A  11/1981  Widergren et al.
4,394,774 A  7/1983  Widergren et al.
4,574,351 A  3/1986  Dang et al.

(Continued)

FOREIGN PATENT DOCUMENTS

DE  4127518 A1  2/1992

(Continued)

OTHER PUBLICATIONS

IBM, Fast Dos Soft Boot, Feb. 1, 1994, vol. 37, Issue 2B, pp. 185-186.*

(Continued)

*Primary Examiner*—Thomas Lee
*Assistant Examiner*—Suresh K Suryawanshi
(74) *Attorney, Agent, or Firm*—Fish & Neave IP Group of Ropes & Gray LLP

(57) ABSTRACT

Systems and methods are provided for accelerated loading of operating system and application programs upon system boot or application launch. In one aspect, a method for providing accelerated loading of an operating system includes maintaining a list of boot data used for booting a computer system, preloading the boot data upon initialization of the computer system, and servicing requests for boot data from the computer system using the preloaded boot data. The boot data may comprise program code associated with an operating system of the computer system, an application program, and a combination thereof. The boot data is retrieved from a boot device and stored in a cache memory device. The boot data is stored in a compressed format on the boot device and the preloaded boot data is decompressed prior to transmitting the preloaded boot data to the requesting system.

31 Claims, 13 Drawing Sheets

U.S. PATENT DOCUMENTS

| | | | |
|---|---|---|---|
| 4,593,324 A | 6/1986 | Ohkubo et al. | |
| 4,682,150 A | 7/1987 | Mathes et al. | |
| 4,730,348 A | 3/1988 | MacCrisken | |
| 4,754,351 A | 6/1988 | Wright | |
| 4,804,959 A | 2/1989 | Makansi et al. | |
| 4,870,415 A | 9/1989 | Van Maren et al. | |
| 4,872,009 A | 10/1989 | Tsukiyama et al. | |
| 4,876,541 A | 10/1989 | Storer | |
| 4,888,812 A | 12/1989 | Dinan et al. | |
| 4,906,995 A | 3/1990 | Swanson | |
| 4,929,946 A | 5/1990 | O'Brien et al. | |
| 4,953,324 A | 9/1990 | Herrmann | |
| 4,965,675 A | 10/1990 | Hori et al. | |
| 5,028,922 A | 7/1991 | Huang | |
| 5,045,848 A | 9/1991 | Fascenda | |
| 5,045,852 A | 9/1991 | Mitchell et al. | |
| 5,046,027 A | 9/1991 | Taaffe et al. | |
| 5,049,881 A | 9/1991 | Gibson et al. | |
| 5,097,261 A | 3/1992 | Langdon, Jr. et al. | |
| 5,113,522 A | 5/1992 | Dinwiddie, Jr. et al. | |
| 5,121,342 A | 6/1992 | Szymborski | |
| 5,150,430 A | 9/1992 | Chu | |
| 5,159,336 A | 10/1992 | Rabin et al. | |
| 5,175,543 A | 12/1992 | Lantz | |
| 5,179,651 A | 1/1993 | Taaffe et al. | |
| 5,187,793 A | 2/1993 | Keith et al. | |
| 5,191,431 A | 3/1993 | Hasegawa et al. | |
| 5,204,756 A | 4/1993 | Chevion et al. | |
| 5,209,220 A | 5/1993 | Hiyama et al. | |
| 5,212,742 A | 5/1993 | Normile et al. | |
| 5,226,176 A | 7/1993 | Westaway et al. | |
| 5,227,893 A | 7/1993 | Ett | |
| 5,231,492 A | 7/1993 | Dangi et al. | |
| 5,237,460 A | 8/1993 | Miller et al. | |
| 5,237,675 A | 8/1993 | Hannon, Jr. | |
| 5,243,341 A | 9/1993 | Seroussi et al. | |
| 5,243,348 A | 9/1993 | Jackson | |
| 5,247,638 A | 9/1993 | O'Brien et al. | |
| 5,247,646 A | 9/1993 | Osterlund et al. | |
| 5,263,168 A | 11/1993 | Toms et al. | |
| 5,270,832 A | 12/1993 | Balkanski et al. | |
| 5,287,420 A | 2/1994 | Barrett | |
| 5,293,379 A | 3/1994 | Carr | |
| 5,307,497 A * | 4/1994 | Feigenbaum et al. | 713/1 |
| 5,309,555 A | 5/1994 | Akins et al. | |
| 5,355,498 A | 10/1994 | Provino et al. | |
| 5,357,614 A | 10/1994 | Pattisam et al. | |
| 5,379,036 A | 1/1995 | Storer | |
| 5,379,757 A | 1/1995 | Hiyama et al. | |
| 5,381,145 A | 1/1995 | Allen et al. | |
| 5,394,534 A | 2/1995 | Kulakowski et al. | |
| 5,396,228 A | 3/1995 | Garahi | |
| 5,400,401 A | 3/1995 | Wasilewski et al. | |
| 5,403,639 A | 4/1995 | Belsan et al. | |
| 5,406,278 A | 4/1995 | Graybill et al. | |
| 5,406,279 A | 4/1995 | Anderson et al. | |
| 5,412,384 A | 5/1995 | Chang et al. | |
| 5,414,850 A | 5/1995 | Whiting | |
| 5,420,639 A | 5/1995 | Perkins | |
| 5,452,287 A | 9/1995 | Dicecco | |
| 5,461,679 A | 10/1995 | Normile et al. | |
| 5,467,087 A | 11/1995 | Chu | |
| 5,471,206 A | 11/1995 | Allen et al. | |
| 5,479,587 A | 12/1995 | Campbell et al. | |
| 5,486,826 A | 1/1996 | Remillard | |
| 5,495,244 A | 2/1996 | Jeong et al. | |
| 5,506,844 A | 4/1996 | Rao | |
| 5,506,872 A | 4/1996 | Mohler | |
| 5,530,845 A | 6/1996 | Hiatt et al. | |
| 5,533,051 A | 7/1996 | James | |
| 5,535,356 A | 7/1996 | Kim et al. | |
| 5,537,658 A | 7/1996 | Bakke et al. | |
| 5,557,551 A | 9/1996 | Craft | |
| 5,557,668 A | 9/1996 | Brady | |
| 5,557,749 A | 9/1996 | Norris | |
| 5,561,824 A | 10/1996 | Carreiro et al. | |
| 5,574,952 A | 11/1996 | Brady et al. | |
| 5,576,953 A | 11/1996 | Hugentobler | |
| 5,583,500 A | 12/1996 | Allen et al. | |
| 5,590,306 A | 12/1996 | Watanabe et al. | |
| 5,596,674 A | 1/1997 | Bhandari et al. | |
| 5,604,824 A | 2/1997 | Chui et al. | |
| 5,606,706 A | 2/1997 | Takamoto et al. | |
| 5,612,788 A | 3/1997 | Stone | |
| 5,613,069 A | 3/1997 | Walker | |
| 5,615,017 A | 3/1997 | Choi | |
| 5,621,820 A | 4/1997 | Rynderman et al. | |
| 5,623,623 A | 4/1997 | Kim et al. | |
| 5,623,701 A | 4/1997 | Bakke et al. | |
| 5,627,534 A | 5/1997 | Craft | |
| 5,627,995 A | 5/1997 | Miller et al. | |
| 5,629,732 A | 5/1997 | Moskowitz et al. | |
| 5,630,092 A | 5/1997 | Carreiro et al. | |
| 5,635,632 A | 6/1997 | Fay et al. | |
| 5,635,932 A | 6/1997 | Shinagawa et al. | |
| 5,642,506 A | 6/1997 | Lee | |
| 5,649,032 A | 7/1997 | Burt et al. | |
| 5,652,795 A | 7/1997 | Dillon et al. | |
| 5,652,857 A | 7/1997 | Shimoi et al. | |
| 5,652,917 A | 7/1997 | Maupin et al. | |
| 5,654,703 A | 8/1997 | Clark, II | |
| 5,655,138 A | 8/1997 | Kikinis | |
| 5,666,560 A | 9/1997 | Moertl et al. | |
| 5,668,737 A | 9/1997 | Iler | |
| 5,671,389 A | 9/1997 | Saliba | |
| 5,675,333 A | 10/1997 | Boursier et al. | |
| 5,694,619 A | 12/1997 | Konno | |
| 5,696,927 A | 12/1997 | MacDonald et al. | |
| 5,703,793 A | 12/1997 | Wise et al. | |
| 5,715,477 A | 2/1998 | Kikinis | |
| 5,717,393 A | 2/1998 | Nakano et al. | |
| 5,717,394 A | 2/1998 | Schwartz et al. | |
| 5,719,862 A | 2/1998 | Lee et al. | |
| 5,721,958 A | 2/1998 | Kikinis | |
| 5,724,475 A | 3/1998 | Kirsten | |
| 5,729,228 A | 3/1998 | Franaszek et al. | |
| 5,748,904 A | 5/1998 | Huang et al. | |
| 5,757,852 A | 5/1998 | Jericevic et al. | |
| 5,771,340 A | 6/1998 | Nakazato et al. | |
| 5,778,411 A | 7/1998 | DeMoss et al. | |
| 5,781,767 A | 7/1998 | Inoue et al. | |
| 5,784,572 A | 7/1998 | Rostoker et al. | |
| 5,787,487 A | 7/1998 | Hashimoto et al. | |
| 5,796,864 A | 8/1998 | Callahan | |
| 5,799,110 A | 8/1998 | Israelsen et al. | |
| 5,805,932 A | 9/1998 | Kawashima et al. | |
| 5,808,660 A | 9/1998 | Sekine et al. | |
| 5,809,176 A | 9/1998 | Yajima | |
| 5,809,337 A | 9/1998 | Hannah et al. | |
| 5,812,789 A | 9/1998 | Diaz et al. | |
| 5,818,368 A | 10/1998 | Langley | |
| 5,818,369 A | 10/1998 | Withers | |
| 5,818,530 A | 10/1998 | Canfield et al. | |
| 5,819,215 A | 10/1998 | Dobson et al. | |
| 5,825,424 A | 10/1998 | Canfield et al. | |
| 5,832,037 A | 11/1998 | Park | |
| 5,832,126 A | 11/1998 | Tanaka | |
| 5,836,003 A | 11/1998 | Sadeh | |
| 5,838,996 A | 11/1998 | deCarmo | |
| 5,839,100 A | 11/1998 | Wegener | |
| 5,841,979 A | 11/1998 | Schulhof et al. | |
| 5,847,762 A | 12/1998 | Canfield | |
| 5,861,824 A | 1/1999 | Ryu et al. | |
| 5,861,920 A | 1/1999 | Mead et al. | |

| | | |
|---|---|---|
| 5,867,167 A | 2/1999 | Deering |
| 5,870,036 A | 2/1999 | Franaszek et al. |
| 5,870,087 A | 2/1999 | Chau |
| 5,872,530 A | 2/1999 | Domyo et al. |
| 5,883,975 A | 3/1999 | Narita et al. |
| 5,886,655 A | 3/1999 | Rust |
| 5,889,961 A | 3/1999 | Dobbek |
| 5,915,079 A | 6/1999 | Vondran, Jr. et al. |
| 5,917,438 A | 6/1999 | Ando |
| 5,920,326 A | 7/1999 | Rentschler et al. |
| 5,936,616 A | 8/1999 | Torborg, Jr. et al. |
| 5,949,355 A | 9/1999 | Panaoussis |
| 5,955,976 A | 9/1999 | Heath |
| 5,960,465 A | 9/1999 | Adams |
| 5,964,842 A | 10/1999 | Packard |
| 5,968,149 A | 10/1999 | Jaquette et al. |
| 5,973,630 A | 10/1999 | Heath |
| 5,974,471 A | 10/1999 | Belt |
| 5,982,723 A | 11/1999 | Kamatani |
| 5,991,515 A | 11/1999 | Fall et al. |
| 5,996,033 A | 11/1999 | Chiu-Hao |
| 6,000,009 A | 12/1999 | Brady |
| 6,002,411 A | 12/1999 | Dye |
| 6,003,115 A * | 12/1999 | Spear et al. ............... 711/137 |
| 6,011,901 A | 1/2000 | Kirsten |
| 6,014,694 A | 1/2000 | Aharoni et al. |
| 6,026,217 A | 2/2000 | Adiletta |
| 6,028,725 A | 2/2000 | Blumenau |
| 6,031,939 A | 2/2000 | Gilbert et al. |
| 6,032,148 A | 2/2000 | Wilkes |
| 6,061,398 A | 5/2000 | Satoh et al. |
| 6,073,232 A * | 6/2000 | Kroeker et al. ............... 713/1 |
| 6,075,470 A | 6/2000 | Little et al. |
| 6,094,634 A | 7/2000 | Yahagi et al. |
| 6,097,520 A | 8/2000 | Kadnier |
| 6,104,389 A | 8/2000 | Ando |
| 6,105,130 A | 8/2000 | Wu et al. |
| 6,128,412 A | 10/2000 | Satoh |
| 6,141,053 A | 10/2000 | Saukkonen |
| 6,145,069 A | 11/2000 | Dye |
| 6,169,241 B1 | 1/2001 | Shimizu |
| 6,172,936 B1 | 1/2001 | Kitazaki |
| 6,173,381 B1 * | 1/2001 | Dye ........................ 711/170 |
| 6,182,125 B1 | 1/2001 | Borella et al. |
| 6,192,082 B1 | 2/2001 | Moriarty et al. |
| 6,195,024 B1 | 2/2001 | Fallon |
| 6,226,667 B1 * | 5/2001 | Matthews et al. ........... 709/203 |
| 6,226,740 B1 * | 5/2001 | Iga .............................. 713/2 |
| 6,253,264 B1 | 6/2001 | Sebastian |
| 6,272,627 B1 | 8/2001 | Mann |
| 6,272,628 B1 | 8/2001 | Aguilar et al. |
| 6,282,641 B1 | 8/2001 | Christensen |
| 6,309,424 B1 | 10/2001 | Fallon |
| 6,317,714 B1 | 11/2001 | Del Castillo et al. |
| 6,330,622 B1 | 12/2001 | Schaefer |
| 6,345,307 B1 | 2/2002 | Booth |
| 6,421,387 B1 | 7/2002 | Rhee |
| 6,434,168 B1 | 8/2002 | Kari |
| 6,434,695 B1 * | 8/2002 | Esfahani et al. ............... 713/2 |
| 6,442,659 B1 | 8/2002 | Blumenau |
| 6,449,682 B1 | 9/2002 | Toorians |
| 6,452,602 B1 | 9/2002 | Morein |
| 6,463,509 B1 * | 10/2002 | Teoman et al. ............. 711/137 |
| 6,487,640 B1 | 11/2002 | Lipasti |
| 6,489,902 B2 | 12/2002 | Heath |
| 6,513,113 B1 | 1/2003 | Kobayashi |
| 6,529,633 B1 | 3/2003 | Easwar et al. |
| 6,539,456 B2 * | 3/2003 | Stewart ....................... 711/113 |
| 6,542,644 B1 | 4/2003 | Satoh |
| 6,590,609 B1 | 7/2003 | Kitade et al. |
| 6,601,104 B1 | 7/2003 | Fallon |
| 6,604,158 B1 | 8/2003 | Fallon |
| 6,606,040 B2 | 8/2003 | Abdat |
| 6,606,413 B1 | 8/2003 | Zeineh |
| 6,609,223 B1 | 8/2003 | Wolfgang |
| 6,618,728 B1 | 9/2003 | Rail |
| 6,624,761 B2 | 9/2003 | Fallon |
| 6,661,839 B1 | 12/2003 | Ishida et al. |
| 6,704,840 B2 * | 3/2004 | Nalawadi et al. ........... 711/118 |
| 6,711,709 B1 | 3/2004 | York |
| 6,745,282 B2 | 6/2004 | Okada et al. |
| 6,748,457 B2 | 6/2004 | Fallon |
| 6,856,651 B2 | 2/2005 | Singh |
| 6,888,893 B2 | 5/2005 | Li et al. |
| 7,054,493 B2 | 5/2006 | Schwartz |
| 2001/0032128 A1 | 10/2001 | Kepecs |
| 2002/0037035 A1 | 3/2002 | Singh |
| 2002/0104891 A1 | 8/2002 | Otto |
| 2002/0126755 A1 | 9/2002 | Li et al. |
| 2003/0034905 A1 | 2/2003 | Anton et al. |
| 2003/0084238 A1 | 5/2003 | Okada et al. |
| 2003/0142874 A1 | 7/2003 | Schwartz |

FOREIGN PATENT DOCUMENTS

| | | |
|---|---|---|
| EP | 0164677 | 12/1985 |
| EP | 0185098 | 6/1986 |
| EP | 0283798 | 9/1988 |
| EP | 0405572 | 6/1990 |
| EP | 0493130 | 12/1991 |
| EP | 0718751 A3 | 6/1992 |
| EP | 0587437 | 9/1993 |
| EP | 0595406 | 5/1994 |
| EP | 0718751 A2 | 6/1996 |
| GB | 2162025 | 1/1986 |
| JP | 06051989 A * | 2/1994 |
| JP | 9188009 | 1/1996 |
| JP | 11149376 | 6/1999 |
| WO | WO 9414273 | 6/1994 |
| WO | WO 9429852 | 12/1994 |
| WO | WO 9502873 | 1/1995 |
| WO | WO 9748212 | 6/1997 |

OTHER PUBLICATIONS

Rice, Robert F., "Some Practical Universal Noiseless Coding Techniques", Jet Propulsion Laboratory, Pasadena, California, JPL Publication 79-22, Mar. 15, 1979.

Anderson, J., et al. "Codec squeezes color teleconferencing through digital telephone lines", Electronics 1984, pp. 13-15.

Venbrux, Jack, "A VLSI Chip Set for High-Speed Lossless Data Compression", IEEE Trans. On Circuits and Systems for Video Technology, vol. 2, No. 44, Dec. 1992, pp. 381-391.

"Operating System Platform Abstraction Method", IBM Technical Disclosure Bulletin, Feb. 1995, vol. 38, Issue No. 2, pp. 343-344.

Murashita, K., et al., "High-Speed Statistical Compression using Self-organized Rules and Predetermined Code Tables", IEEE, 1996 Data Compression Conference.

Coene, W., et al. "A Fast Route For Application of Rate-distortion Optimal Quantization in an MPEG Video Encoder" Proceedings of the International Conference on Image Processing, US., New York, IEEE, Sep. 16, 1996, pp. 825-8286.

Rice, Robert, "Lossless Coding Standards for Space Data Systems", IEEE 1058-6393/97, pp. 577-585.

Yeh, Pen-Shu, "The CCSDS Lossless Data Compression Recommendation for Space Applications", Chapter 16, Lossless Compression Handbook, Elsevier Science (USA), 2003, pp. 311-326.3.

* cited by examiner

SYSTEMS AND METHODS FOR ACCELERATED LOADING OF OPERATING SYSTEMS AND APPLICATION PROGRAMS

CROSS-REFERENCE TO RELATED APPLICATION

This application is based on a U.S. provisional application Ser. No. 60/180,114, filed on Feb. 3, 2000, which is fully incorporated herein by reference.

BACKGROUND

1. Technical Field

The present invention relates generally to systems and methods for providing accelerated loading of operating system and application programs upon system boot or application launch and, more particularly, to data storage controllers employing lossless and/or lossy data compression and decompression to provide accelerated loading of operating systems and application programs.

2. Description of the Related Art

Modem computers utilize a hierarchy of memory devices. To achieve maximum performance levels, modem processors utilize onboard memory and on board cache to obtain high bandwidth access to both program and data. Limitations in process technologies currently prohibit placing a sufficient quantity of onboard memory for most applications. Thus, in order to offer sufficient memory for the operating system(s), application programs, and user data, computers often use various forms of popular off-processor high speed memory including static random access memory (SRAM), synchronous dynamic random access memory (SDRAM), synchronous burst static ram (SBSRAM). Due to the prohibitive cost of the high-speed random access memory, coupled with their power volatility, a third lower level of the hierarchy exists for non-volatile mass storage devices.

Furthermore, mass storage devices offer increased capacity and fairly economical data storage. Mass storage devices (such as a "hard disk") typically store the operating system of a computer system, as well as applications and data and rapid access to such data is critical to system performance. The data storage and retrieval bandwidth of mass storage devices, however, is typically much less as compared with the bandwidth of other elements of a computing system. Indeed, over the last decade, although computer processor performance has improved by at least a factor of 50, magnetic disk storage performance has only improved by a factor of 5. Consequently, memory storage devices severely limit the performance of consumer, entertainment, office, workstation, servers, and mainframe computers for all disk and memory intensive operations.

The ubiquitous Internet combined with new multimedia applications has put tremendous emphasis on storage volumetric density, storage mass density, storewidth, and power consumption. Specifically, storage density is limited by the number of bits that are encoded in a mass storage device per unit volume. Similarly mass density is defined as storage bits per unit mass. Storewidth is the data rate at which the data may be accessed. There are various ways of categorizing storewidth in terms, several of the more prevalent metrics include sustained continuous storewidth, burst storewidth, and random access storewidth, all typically measured in megabytes/sec. Power consumption is canonically defined in terms of power consumption per bit and may be specified under a number of operating modes including active (while data is being accessed and transmitted) and standby mode.

Hence one fairly obvious limitation within the current art is the need for even more volume, mass, and power efficient data storage.

Magnetic disk mass storage devices currently employed in a variety of home, business, and scientific computing applications suffer from significant seek-time access delays along with profound read/write data rate limitations. Currently the fastest available disk drives support only a sustained output data rate in the tens of megabytes per second data rate (MB/sec). This is in stark contrast to the modem Personal Computer's Peripheral Component Interconnect (PCI) Bus's low end 32 bit/33 Mhz input/output capability of 264 MB/sec and the PC's internal local bus capability of 800 MB/sec.

Another problem within the current art is that emergent high performance disk interface standards such as the Small Computer Systems Interface (SCSI-3), Fibre Channel, AT Attachment UltraDMA/66/100, Serial Storage Architecture, and Universal Serial Bus offer only higher data transfer rates through intermediate data buffering in random access memory. These interconnect strategies do not address the fundamental problem that all modem magnetic disk storage devices for the personal computer marketplace are still limited by the same typical physical media restrictions. In practice, faster disk access data rates are only achieved by the high cost solution of simultaneously accessing multiple disk drives with a technique known within the art as data striping and redundant array of independent disks (RAID).

RAID systems often afford the user the benefit of increased data bandwidth for data storage and retrieval. By simultaneously accessing two or more disk drives, data bandwidth may be increased at a maximum rate that is linear and directly proportional to the number of disks employed. Thus another problem with modem data storage systems utilizing RAID systems is that a linear increase in data bandwidth requires a proportional number of added disk storage devices.

Another problem with most modem mass storage devices is their inherent unreliability. Many modem mass storage devices utilize rotating assemblies and other types of electromechanical components that possess failure rates one or more orders of magnitude higher than equivalent solid-state devices. RAID systems employ data redundancy distributed across multiple disks to enhance data storage and retrieval reliability. In the simplest case, data may be explicitly repeated on multiple places on a single disk drive, on multiple places on two or more independent disk drives. More complex techniques are also employed that support various trade-offs between data bandwidth and data reliability.

Standard types of RAID systems currently available include RAID Levels 0, 1, and 5. The configuration selected depends on the goals to be achieved. Specifically data reliability, data validation, data storage/retrieval bandwidth, and cost all play a role in defining the appropriate RAID data storage solution. RAID level 0 entails pure data striping across multiple disk drives. This increases data bandwidth at best linearly with the number of disk drives utilized. Data reliability and validation capability are decreased. A failure of a single drive results in a complete loss of all data. Thus another problem with RAID systems is that low cost improved bandwidth requires a significant decrease in reliability.

RAID Level 1 utilizes disk mirroring where data is duplicated on an independent disk subsystem. Validation of data amongst the two independent drives is possible if the data is simultaneously accessed on both disks and subsequently compared. This tends to decrease data bandwidth from even that of a single comparable disk drive. In systems that offer hot swap capability, the failed drive is removed and a replacement drive is inserted. The data on the failed drive is then copied in the background while the entire system continues to operate in a performance degraded but fully operational mode. Once the data rebuild is complete, normal operation resumes. Hence, another problem with RAID systems is the high cost of increased reliability and associated decrease in performance.

RAID Level 5 employs disk data striping and parity error detection to increase both data bandwidth and reliability simultaneously. A minimum of three disk drives is required for this technique. In the event of a single disk drive failure, that drive may be rebuilt from parity and other data encoded on disk remaining disk drives. In systems that offer hot swap capability, the failed drive is removed and a replacement drive is inserted. The data on the failed drive is then rebuilt in the background while the entire system continues to operate in a performance degraded but fully operational mode. Once the data rebuild is complete, normal operation resumes.

Thus another problem with redundant modem mass storage devices is the degradation of data bandwidth when a storage device fails. Additional problems with bandwidth limitations and reliability similarly occur within the art by all other forms of sequential, pseudo-random, and random access mass storage devices. These and other limitations within the current art are addressed by the present invention.

SUMMARY OF THE INVENTION

The present invention is directed to systems and methods for providing accelerated loading of operating system and application programs upon system boot or application launch and, more particularly, to data storage controllers employing lossless and/or lossy data compression and decompression to provide accelerated loading of operating systems and application programs.

In one aspect of the present invention, a method for providing accelerated loading of an operating system comprises the steps of: maintaining a list of boot data used for booting a computer system; preloading the boot data upon initialization of the computer system; and servicing requests for boot data from the computer system using the preloaded boot data. The boot data may comprise program code associated with an operating system of the computer system, an application program, and a combination thereof. In a preferred embodiment, the boot data is retrieved from a boot device and stored in a cache memory device.

In another aspect, the method for accelerated loading of an operating system comprises updating the list of boot data during the boot process. The step of updating comprises adding to the list any boot data requested by the computer system not previously stored in the list and/or removing from the list any boot data previously stored in the list and not requested by the computer system.

In yet another aspect, the boot data is stored in a compressed format on the boot device and the preloaded boot data is decompressed prior to transmitting the preloaded boot data to the requesting system.

In another aspect, a method for providing accelerated launching of an application program comprises the steps of: maintaining a list of application data associated with an application program; preloading the application data upon launching the application program; and servicing requests for application data from a computer system using the preloaded application data.

In yet another aspect, a boot device controller for providing accelerated loading of an operating system of a host system comprises: a digital signal processor (DSP); a programmable logic device, wherein the programmable logic device is programmed by the digital signal processor to (i) instantiate a first interface for operatively interfacing the boot device controller to a boot device and to (ii) instantiate a second interface for operatively interfacing the boot device controller to the host system; and a non-volatile memory device, for storing logic code associated with the DSP, the first interface and the second interface, wherein the logic code comprises instructions executable by the DSP for maintaining a list of boot data used for booting the host system, preloading the boot data upon initialization of the host system, and servicing requests for boot data from the host system using the preloaded boot data. The boot device controller further includes a cache memory device for storing the preloaded boot data.

The present invention is realized due to recent improvements in processing speed, inclusive of dedicated analog and digital hardware circuits, central processing units, (and any hybrid combinations thereof), that, coupled with advanced data compression and decompression algorithms are enabling of ultra high bandwidth data compression and decompression methods that enable improved data storage and retrieval bandwidth These and other aspects, features and advantages, of the present invention will become apparent from the following detailed description of preferred embodiments that is to be read in connection with the accompanying drawings.

DETAILED DESCRIPTION OF PREFERRED EMBODIMENTS

Figure 1:
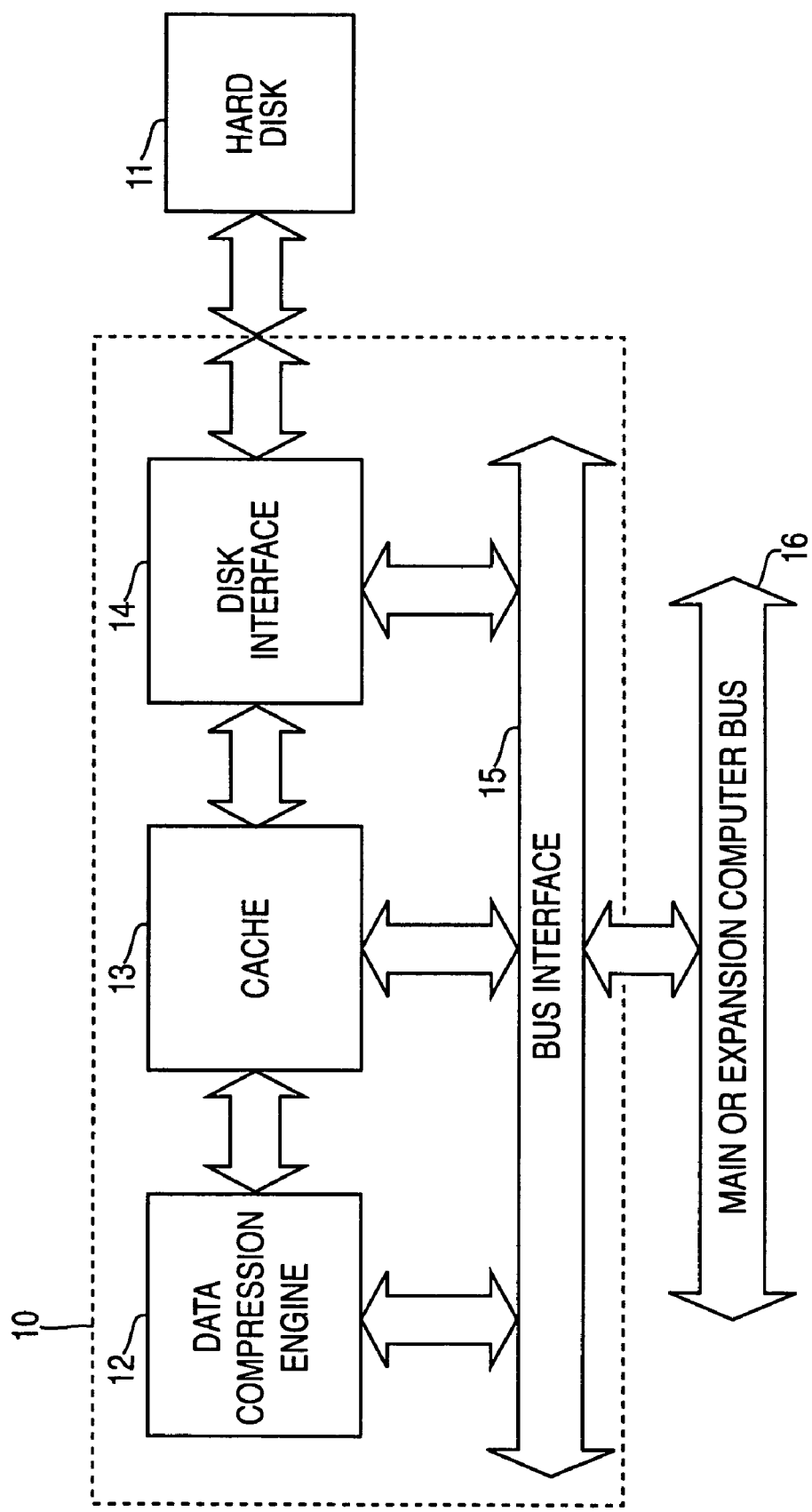
FIG. 1 is a block diagram of a data storage controller according to one embodiment of the present invention.

In the following description, it is to be understood that system elements having equivalent or similar functionality are designated with the same reference numerals in the Figures. It is to be further understood that the present invention may be implemented in various forms of hardware, software, firmware, or a combination thereof. Preferably, the present invention is implemented on a computer platform including hardware such as one or more central processing units (CPU) or digital signal processors (DSP), a random access memory (RAM), and input/output (I/O) interface(s). The computer platform may also include an operating system, microinstruction code, and dedicated processing hardware utilizing combinatorial logic or finite state machines. The various processes and functions described herein may be either part of the hardware, microinstruction code or application programs that are executed via the operating system, or any combination thereof.

It is to be further understood that, because some of the constituent system components described herein are preferably implemented as software modules, the actual system connections shown in the Figures may differ depending upon the manner in that the systems are programmed. It is to be appreciated that special purpose microprocessors, dedicated hardware, or and combination thereof may be employed to implement the present invention. Given the teachings herein, one of ordinary skill in the related art will be able to contemplate these and similar implementations or configurations of the present invention.

I. System Architectures

The present invention is directed to data storage controllers that provide increased data storage/retrieval rates that are not otherwise achievable using conventional disk controller systems and protocols to store/retrieve data to/from mass storage devices. The concept of "accelerated" data storage and retrieval was introduced in U.S. patent application Ser. No. 09/266,394, filed Mar. 11, 1999, entitled "System and Methods For Accelerated Data Storage and Retrieval", which is now U.S. Pat. No. 6,601,104 and U.S. patent application Ser. No. 09/481,243, filed Jan. 11, 2000, entitled "System and Methods For Accelerated Data Storage and Retrieval," which is now U.S. Pat. No. 6,604,158, both of which are commonly assigned and incorporated herein by reference. In general, as described in the above-incorporated applications, "accelerated" data storage comprises receiving a digital data stream at a data transmission rate which is greater than the data storage rate of a target storage device, compressing the input stream at a compression rate that increases the effective data storage rate of the target storage device and storing the compressed data in the target storage device. For instance, assume that a mass storage device (such as a hard disk) has a data storage rate of 20 megabytes per second. If a storage controller for the mass storage device is capable of compressing an input data stream with an average compression rate of 3:1, then data can be stored in the mass storage device at a rate of 60 megabytes per second, thereby effectively increasing the storage bandwidth ("storewidth") of the mass storage device by a factor of three. Similarly, accelerated data retrieval comprises retrieving a compressed digital data stream from a target storage device at the rate equal to, e.g., the data access rate of the target storage device and then decompressing the compressed data at a rate that increases the effective data access rate of the target storage device. Advantageously, accelerated data storage/retrieval mitigates the traditional bottleneck associated with, e.g., local and network disk accesses.

Referring now to FIG. 1, a high level block diagram illustrates a data storage controller 10 according to one embodiment of the present invention. The data storage controller 10 comprises a data compression engine 12 for compressing/decompressing data (preferably in real-time or psuedo real-time) stored/retrieved from a hard disk 11 (or any other type of mass storage device) to provide accelerated data storage/retrieval. The DCE 12 preferably employs the data compression/decompression techniques disclosed in U.S. Ser. No. 09/210,491 entitled "Content Independent Data Compression Method and System," filed on Dec. 11, 1998, which is now U.S. Pat. No. 6,195,024 which is commonly assigned and which is fully incorporated herein by reference. It is to be appreciated that the compression and decompression systems and methods disclosed in U.S. Ser. No. 09/210,491 are suitable for compressing and decompressing data at rates, which provide accelerated data storage and retrieval. A detailed discussion of a preferred "content independent" data compression process will be provided below.

The data storage controller 10 further comprises a cache 13, a disk interface (or disk controller) 14 and a bus interface 15. The storage controller 10 is operatively connected to the hard disk 12 via the disk controller 14 and operatively connected to an expansion bus (or main bus) 16 of a computer system via the bus interface 15. The disk interface 14 may employ a known disk interface standard such as UltraDMA, SCSI, Serial Storage Architecture, FibreChannel or any other interface that provides suitable disk access data rates. In addition, the storage controller 10 preferably utilizes the American National Standard for Information Systems (ANSI) AT Attachment Interface (ATA/ATAPI-4) to connect the data storage controller 10 to the hard disk 12. As is known in the art, this standard defines the connectors and cables for the physical interconnects between the data storage controller and the storage devices, along with the electrical and logical characteristics of the interconnecting signals.

Further, the bus interface 15 may employ a known standard such as the PCI (Peripheral Component Interconnect) bus interface for interfacing with a computer system. The use of industry standard interfaces and protocols is preferable, as it allows the storage controller 10 to be backwards compatible and seamlessly integrated with current systems. However in new designs the present invention may be utilize any suitable computer interface or combination thereof.

It is to be understood that although FIG. 1 illustrates a hard disk 12, the storage controller 10 may be employed with any form of memory device including all forms of sequential, pseudo-random, and random access storage devices. Storage devices as known within the current art include all forms of random access memory, magnetic and optical tape, magnetic and optical disks, along with various other forms of solid-state mass storage devices. The current invention applies to all forms and manners of memory devices including, but not limited to, storage devices utilizing magnetic, optical, and chemical techniques, or any combination thereof. In addition, the cache 13 may comprise volatile or non-volatile memory, or any combination thereof. Preferably, the cache 13 is implemented in SDRAM (static dynamic random access memory).

The system of FIG. 1 generally operates as follows. When data is read from disk by the host computer, data flows from the disk 11 through the data storage controller 10 to the host computer. Data is stored in one of several proprietary compression formats on the disk 11 (e.g., "content independent" data compression). Data blocks are pre-specified in length, comprised of single or multiple sectors, and are typically handled in fractional or whole equivalents of tracks, e.g. ½ track, whole track, multiple tracks, etc. To read disk data, a DMA transfer is setup from the disk interface 14 to the onboard cache memory 13. The disk interface 14 comprises integral DMA control to allow transfer of data from the disk 11 directly to the onboard cache 13 without intervention by the DCE 12. It should be noted that the DCE 12 acts as a system level controller and sets-up specific registers within both the disk interface 14 and bus interface 15 to facilitate DMA transfers to and from the cache memory 13. To initiate a transfer from the disk 11 to the cache 13, the DMA transfer is setup via specifying the appropriate command (read disk), the source address (disk logical block number), amount of data to be transferred (number of disk logical blocks), and destination address within the onboard cache memory 13. Then, a disk data interrupt signal ("DISKINT#") is cleared (if previously set and not cleared) and the command is initiated by writing to the appropriate address space. Once data has been read from disk 11 and placed into onboard cache memory 13, the DISKINT# interrupt is asserted notifying the DCE 12 that requested data is now available in the cache memory 13. Data is then read by the DMA controller within the DCE 12 and placed into local memory for subsequent decompression. The decompressed data is then DMA transferred from the local memory of the DCE 12 back to the cache memory 13. Finally, data is DMA transferred via the bus interface controller 15 from the cache memory 13 to the bus 16. It is to be understood that in the read mode, the data storage controller acts as a bus master. A bus DMA transfer is then setup via specifying the appropriate command (write to host computer), the source address within the cache memory 13, the quantity of data words to be transferred (transfers are preferably in 4 byte increments), and the destination address on the host computer. When a bus 16 read or write transaction has completed, the appropriate interrupt signals (respectively referred to as PCIRDINT# and PCIWRINT# ) are asserted to the DCE 12. Either of these interrupts are cleared by a corresponding interrupt service routines through a read or write to the appropriate address of the DCE 12.

Similarly, when data is written to the disk 11 from the host computer, data flows from the host computer through the data storage controller 10 and onto disk 11. Data is normally received from the host computer in uncompressed (raw) format and is compressed by the DCE 12 and stored on the disk 11. Data blocks from the host are pre-specified in length and are typically handled in blocks that are a fixed multiplier higher than fractional or whole equivalents of tracks, e.g. ½ track, whole track, multiple tracks, etc. This multiplier is preferably derived from the expected average compression ratio that is selected when the disk is formatted with the virtual file management system. To read host computer data, a bus DMA transfer is setup from the host bus 16 to the onboard cache memory 13. The bus interface controller 15 comprises integral DMA control that allows large block transfers from the host computer directly to the onboard cache 13 without intervention by the DCE 12. The bus interface controller 15 acts as a host computer Bus Master when executing such transfer. Once data has been read from the host and placed into onboard cache memory 13, the data is read by the onboard DMA controller (residing on the DCE 12) and placed into local memory for subsequent compression. The compressed data is then DMA transferred from the local memory of the DCE 12 back to the cache memory 13. Finally, data is DMA transferred via the disk controller 14 from the cache 13 to the disk 11.

As discussed in greater detail below, upon host computer power-up or external user reset, the data storage controller 10 initializes the onboard interfaces 14, 15 prior to release of the external host bus 16 from reset. The processor of the host computer then requests initial data from the disk 11 to facilitate the computer's boot-up sequence. The host computer requests disk data over the Bus 16 via a command packet issued from the host computer. Command packets are preferably eight words long (in a preferred embodiment, each word comprises 32 bits). Commands are written from the host computer to the data storage controller 10 with the host computer as the Bus Master and the data storage controller 10 as the slave. The data storage controller 10 includes at least one Base Address Register (BAR) for decoding the address of a command queue of the data storage controller 10. The command queue resides within the cache 13 or within onboard memory of the DCE 12.

When a command is received from the host computer, an interrupt (referred to herein as PCICMDINT#) is generated to the DCE processor. The eight-word command is read by the DCE 12 and placed into the command queue. Because the commands occupy a very small amount of memory, the location of the command queue is at the discretion of software and the associated system level performance considerations. Commands may be moved from the bus interface 16 to the command queue by wither explicit reads and writes by the DCE processor or, as explained below, by utilizing programmed DMA from an Enhanced DMA Controller (EDMA) residing on the DCE 12. This second technique may better facilitate system throughput by allowing the EDMA to automatically load commands while the highly pipelined data compression and decompression processing in the DCE is executed fully undisturbed.

The DCE 12, disk interface 14 and bus interface 15 commonly share the cache 13. As explained in detail below, the storage controller 10 preferably provides maximum system bandwidth by allowing simultaneous data transfers between the disk 12 and cache 13, the DCE 12 and the cache 13, and the expansion bus 16 and the cache 13. This is realized by employing an integral DMA (direct memory access) protocol that allows the DCE 12, disk interface 14 and bus interface 15 to transfer data without interrupting or interfering with other ongoing processes. In particular, as explained in detail below, an integral bandwidth allocation controller (or arbitrator) is preferably employed to allow the DCE 12, disk controller 14, and bus interface 15 to access the onboard cache with a bandwidth proportional to the overall bandwidth of the respective interface or processing element. The bandwidth arbitration occurs transparently and does not introduce latency in memory accesses. Bandwidth division is preferably performed with a high degree of granularity to minimize the size of requisite onboard buffers to synchronize data from the disk interface 14 and bus interface 15.

It is to be appreciated that the implementation of a storage controller according to the present invention significantly accelerates the performance of a computer system and significantly increases hard disk data storage capacity. For instance, depending on the compression rate, for personal computers running standard Microsoft Windows® based business application software, the storage controller provides: (1) an increase of n:1 in disk storage capacity(for example, assuming a compression ration of 3:1, a 20 gigabyte hard drive effectively becomes a 60 gigabyte hard drive) (2) a significant decrease in the computer boot-up time (turn-on and operating system load) and the time for loading application software and (3) User data storage and retrieval is increased by a factor of n:1.

Figure 2:
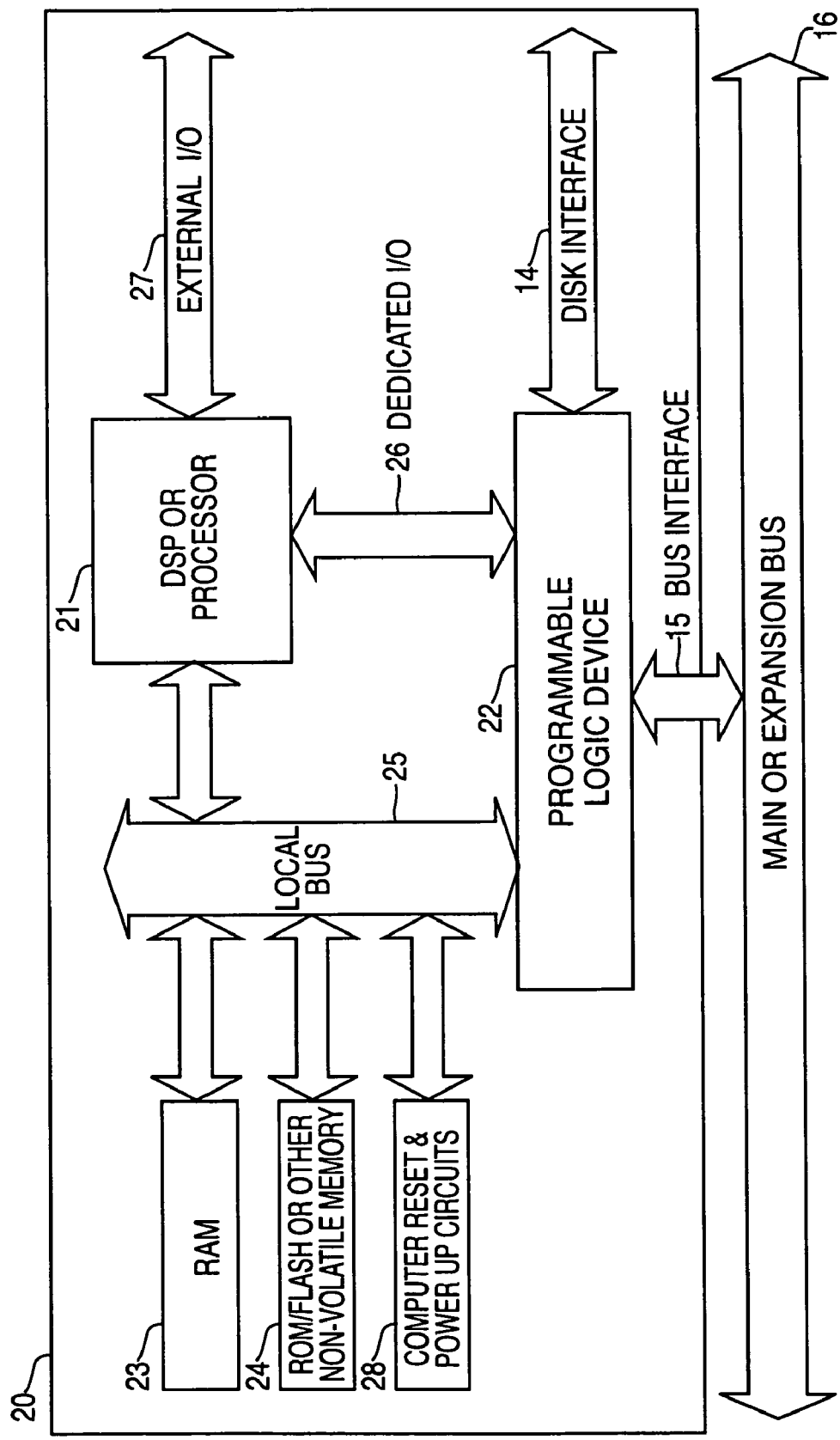
FIG. 2 is a block diagram of a data storage controller according to another embodiment of the present invention.

Referring now to FIG. 2, a block diagram illustrates a data storage controller 20 according to another embodiment of the present invention. More specifically, FIG. 2 illustrates a PCB (printed circuit board) implementation of the data storage controller 10 of FIG. 1. The storage controller 20 comprises a DSP (digital signal processor) 21 (or any other micro-processor device) that implements the DCE 12 of FIG. 1. The storage controller 21 further comprises at least one programmable logic device 22 (or volatile logic device). The programmable logic device 22 preferably implements the logic (program code) for instantiating and driving both the disk interface 14 and the bus interface 15 and for providing full DMA capability for the disk and bus interfaces 14, 15. Further, as explained in detail below, upon host computer power-up and/or assertion of a system-level "reset" (e.g., PCI Bus reset), the DSP 21 initializes and programs the programmable logic device 22 before of the completion of initialization of the host computer. This advantageously allows the data storage controller 20 to be ready to accept and process commands from the host computer (via the bus 16) and retrieve boot data from the disk (assuming the data storage controller 20 is implemented as the boot device and the hard disk stores the boot data (e.g., operating system, etc.)).

The data storage controller 20 further comprises a plurality of memory devices including a RAM (random access memory) device 23 and a ROM (read only memory) device 24 (or FLASH memory or other types of non-volatile memory). The RAM device 23 is utilized as on-board cache and is preferably implemented as SDRAM (preferably, 32 megabytes minimum). The ROM device 24 is utilized for non-volatile storage of logic code associated with the DSP 21 and configuration data used by the DSP 21 to program the programmable logic device 22. The ROM device 24 preferably comprises a one time (erasable) programmable memory (OTP-EPROM) device.

The DSP 21 is operatively connected to the memory devices 23, 24 and the programmable logic device 22 via a local bus 25. The DSP 21 is also operatively connected to the programmable logic device 22 via an independent control bus 26. The programmable logic device 22 provides data flow control between the DSP 21 and the host computer system attached to the bus 16, as well as data flow control between the DSP 21 and the storage device. A plurality of external I/O ports 27 are included for data transmission and/or loading of one programmable logic devices. Preferably, the disk interface 14 driven by the programmable logic device 22 supports a plurality of hard drives.

The storage controller 20 further comprises computer reset and power up circuitry 28 (or "boot configuration circuit") for controlling initialization (either cold or warm boots) of the host computer system and storage controller 20. A preferred boot configuration circuit and preferred computer initialization systems and protocols are described in U.S. patent application Ser. No. 09/775,897, filed concurrently herewith, which is commonly assigned and incorporated herein by reference. Preferably, the boot configuration circuit 28 is employed for controlling the initializing and programming the programmable logic device 22 during configuration of the host computer system (i.e., while the CPU of the host is held in reset). The boot configuration circuit 28 ensures that the programmable logic device 22 (and possibly other volatile or partially volatile logic devices) is initialized and programmed before the bus 16 (such as a PCI bus) is fully reset.

In particular, when power is first applied to the boot configuration circuit 28, the boot configuration circuit 28 generates a control signal to reset the local system (e.g., storage controller 20) devices such as a DSP, memory, and I/O interfaces. Once the local system is powered-up and reset, the controlling device (such as the DSP 21) will then proceed to automatically determine the system environment and configure the local system to work within that environment. By way of example, the DSP 21 of the disk storage controller 20 would sense that the data storage controller 20 is on a PCI computer bus (expansion bus) and has attached to it a hard disk on an IDE interface. The DSP 21 would then load the appropriate PCI and IDE interfaces into the programmable logic device 22 prior to completion of the host system reset. It is to be appreciated that this can be done for all computer busses and boot device interfaces including: PCI, NuBus, ISA, Fiber Channel, SCSI, Ethernet, DSL, ADSL, IDE, DMA, Ultra DMA, and SONET. Once the programmable logic device 22 is configured for its environment, the boot device controller is reset and ready to accept commands over the computer/expansion bus 16. Details of the boot process using a boot device comprising a programmable logic device will be provided below.

It is to be understood that the data storage controller 20 may be utilized as a controller for transmitting data (compressed or uncompressed) to and from remote locations over the DSP I/O ports 27 or system bus 16, for example. Indeed, the I/O ports 27 of the DSP 21 may be used for transmitting data (compressed or uncompressed) that is either retrieved from the disk 11 or received from the host system via the bus 16, to remote locations for processing and/or storage. Indeed, the I/O ports may be operatively connected to other data storage controllers or to a network communication channels. Likewise, the data storage controller 20 may receive data (compressed or uncompressed) over the I/O ports 27 of the DSP 21 from remote systems that are connected to the I/O ports 27 of the DSP, for local processing by the data storage controller 20. For instance, a remote system may remotely access the data storage controller (via the I/O ports of the DSP or system bus 16) to utilize the data compression, in which case the data storage controller would transmit the compressed data back to the system that requested compression.

The DSP 21 may comprise any suitable commercially available DSP or processor. Preferably, the data storage controller 20 utilizes a DSP from Texas Instruments' 320 series, C62x family, of DSPs (such as TMS320C6211GFN-150), although any other DSP or processor comprising a similar architecture and providing similar functionalities may be employed. The preferred DSP is capable of up to 1.2 billion instructions per second. Additional features of the preferred DSP include a highly parallel eight processor single cycle instruction execution, onboard 4K byte LIP Program Cache, 4K L1D Data Cache, and 64K byte Unified L2 Program/Data Cache. The preferred DSP further comprises a 32 bit External Memory Interface (EMIF) that provides for a glueless interface to the RAM 23 and the non-volatile memory 24 (ROM). The DSP further comprises two multi-channel buffered serial ports (McBSPs) and two 32 bit general purpose timers. Preferably, the storage controller disables the I/O capability of these devices and utilizes the I/O ports of the DSP as general purpose I/O for both programming the programmable logic device 22 using a strobed eight bit interface and signaling via a Light Emitting Diode (LED). Ancillary DSP features include a 16 bit Host Port Interface and full JTAG emulation capability for development support.

The programmable logic device 22 may comprise any form of volatile or non-volatile memory. Preferably, the programmable logic device 22 comprises a dynamically reprogrammable FPGA (field programmable gate array) such as the commercially available Xilinx Spartan Series XCS40XL-PQ240-5 FPGA. As discussed in detail herein, the FPGA instantiates and drives the disk and bus interfaces 14, 15.

The non-volatile memory device 24 preferably comprises a 128 Kbyte M27W101-80K one time (erasable) programmable read only memory, although other suitable non-volatile storage devices may be employed. The non-volatile memory device 24 is decoded at a designated memory space in the DSP 21. The non-volatile memory device 24 stores the logic for the DSP 21 and configuration data for the programmable logic device 22. More specifically, in a preferred embodiment, the lower 80 Kbytes of the non-volatile memory device 24 are utilized for storing DSP program code, wherein the first 1 k bytes are utilized for the DSP's boot loader. Upon re configuration circuit 28), the first 1 K of memory of the non-volatile memory device 24 is copied into an internal RAM of the DSP 21 by e.g., the DSP's Enhanced DMA Controller (EDMA). Although the boot process begins when the CPU of the host system is released from external reset, the transfer of the boot code into the DSP and the DSP's initialization of the programmable logic device actually occurs while the CPU of the host system is held in reset. After completion of the 1 K block transfer, the DSP executes the boot loader code and continues thereafter with executing the remainder of the code in non-volatile memory device to program the programmable logic device 22.

More specifically, in a preferred embodiment, the upper 48 K bytes of the non-volatile memory device 24 are utilized for storing configuration data associated with the programmable logic device 22. If the data storage controller 20 is employed as the primary boot storage device for the host computer, the logic for instantiating and driving the disk and bus interfaces 14, 15 should be stored on the data storage controller 20 (although such code may be stored in remotely accessible memory locations) and loaded prior to release of the host system bus 16 from "reset". For instance, revision 2.2 of the PCI Local Bus specification calls for a typical delay of 100 msec from power-stable before release of PCI Reset. In practice this delay is currently 200 msec although this varies amongst computer manufacturers. A detailed discussion of the power-on sequencing and boot operation of the data storage controller 20 will be provided below.

Figure 3:
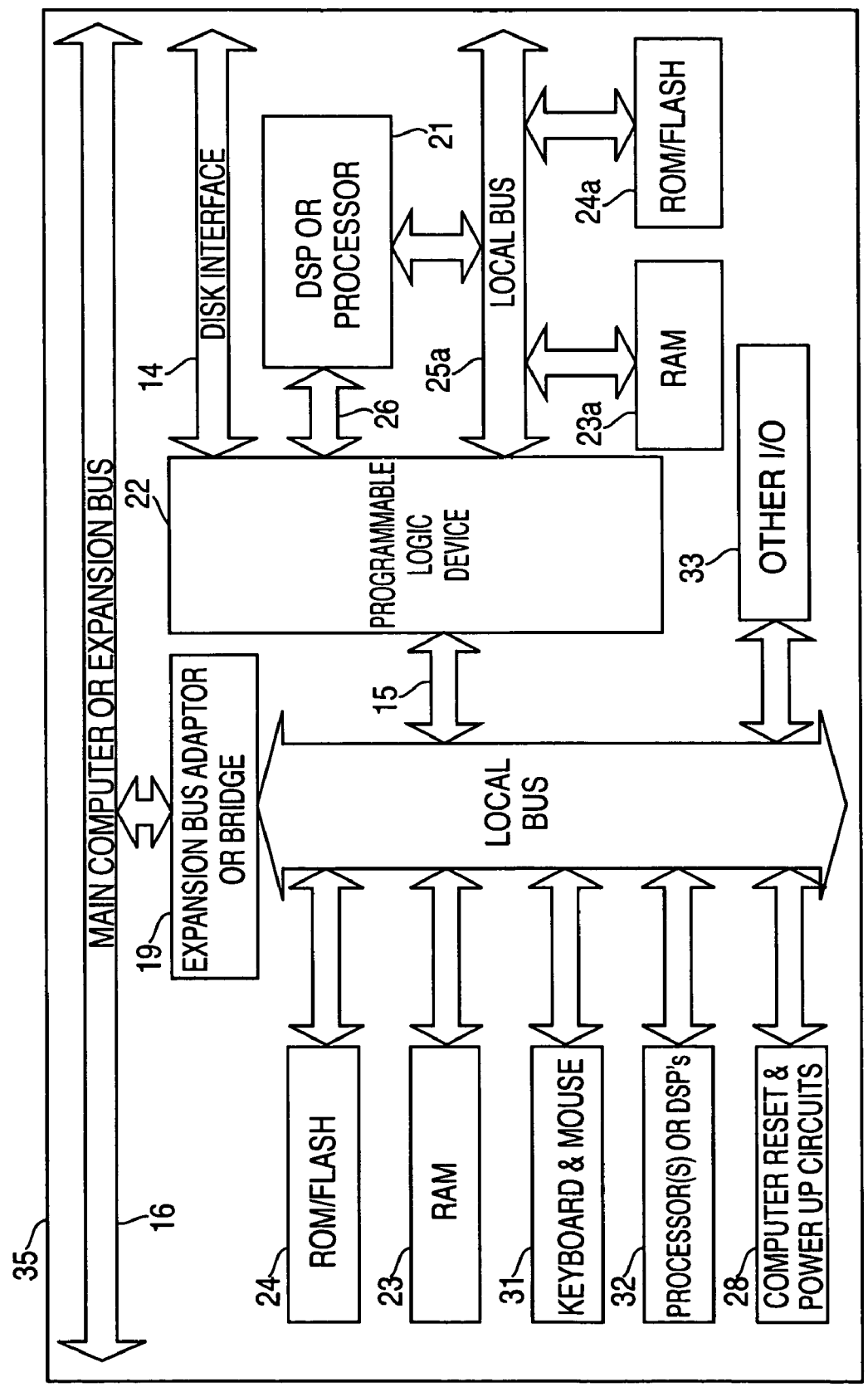
FIG. 3 is a block diagram of a data storage controller according to another embodiment of the present invention.

FIG. 3 illustrates another embodiment of a data storage controller 35 wherein the data storage controller 35 is embedded within the motherboard of the host computer system. This architecture provides the same functionality as the system of FIG. 2, and also adds the cost advantage of being embedded on the host motherboard. The system comprises additional RAM and ROM memory devices 23a, 24a, operatively connected to the DSP 21 via a local bus 25a.

Figure 4:
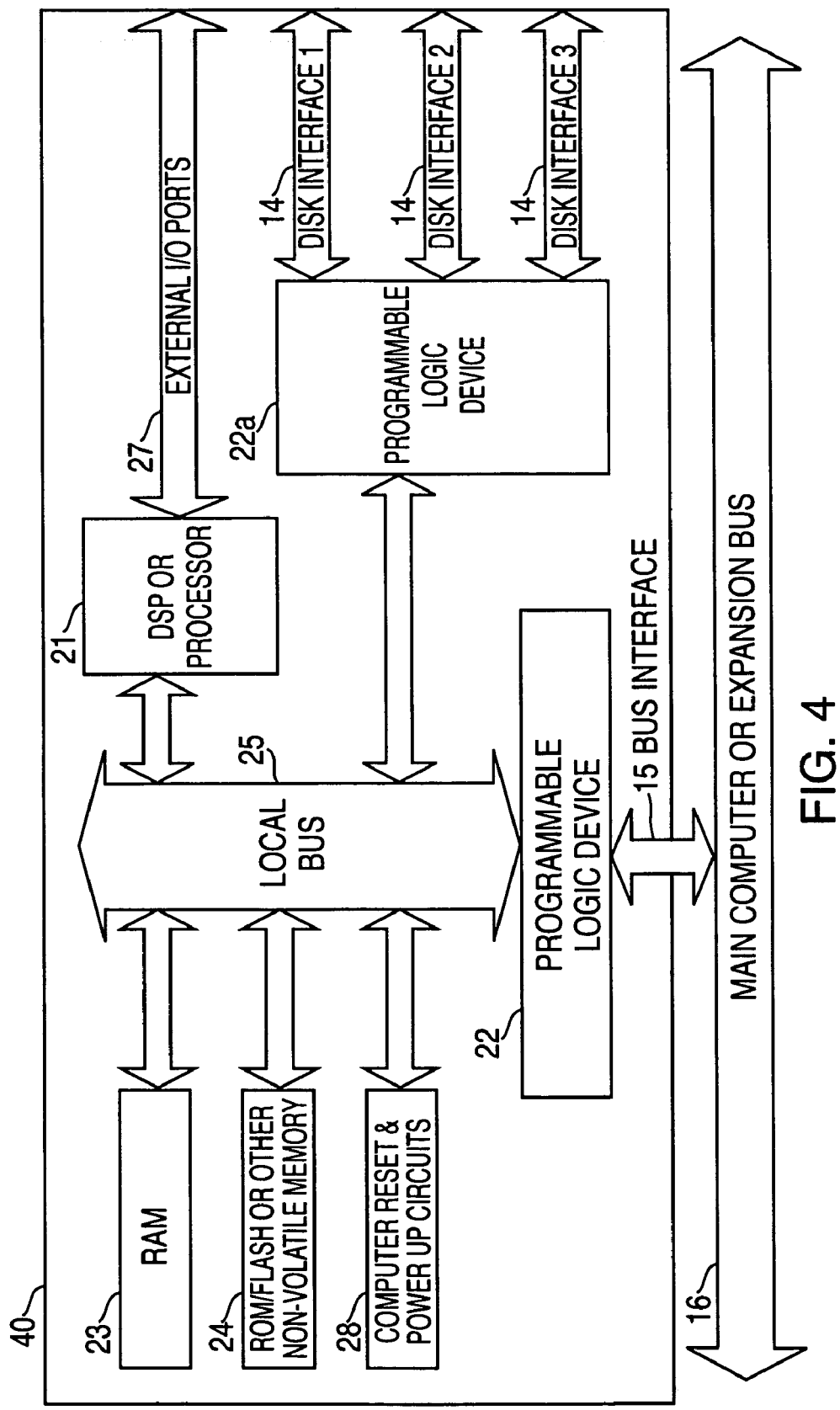
FIG. 4 is a block diagram of a data storage controller according to another embodiment of the present invention.

FIG. 4 illustrates another embodiment of a data storage controller. The data storage controller 40 comprises a PCB implementation that is capable of supporting RAID levels 0,1 and 5. This architecture is similar to those of FIGS. 1 and 2, except that a plurality of programmable logic devices 22, 22a are utilized. The programmable logic device 22 is dedicated to controlling the bus interface 15. The programmable logic device 22a is dedicated to controlling a plurality of disk interfaces 14, preferably three interfaces. Each disk interface 14 can connect up to two drives. The DSP in conjunction with the programmable logic device 22a can operate at RAID level 0, 1 or 5. At RAID level 0, which is disk striping, two interfaces are required. This is also true for RAID level 1, which is disk mirroring. At RAID level 5, all three interfaces are required.

Figure 5:
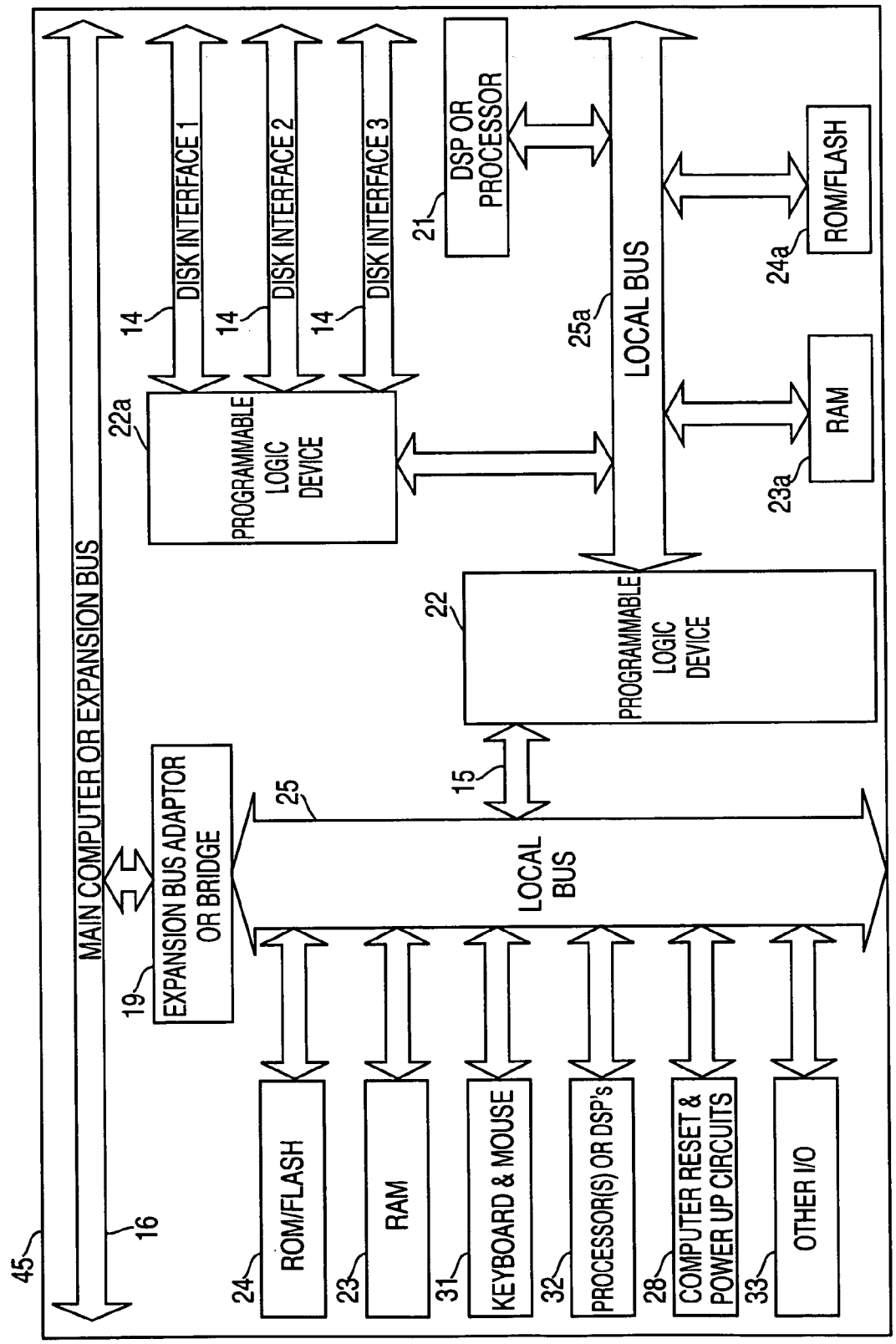
FIG. 5 is a block diagram of a data storage controller according to another embodiment of the present invention.

FIG. 5 illustrates another embodiment of a data storage controller according to the present invention. The data storage controller 45 provides the same functionality as that of FIG. 4, and has the cost advantage of being embedded within the computer system motherboard.

II. Initializing a Programmable Logic Device

As discussed above with reference to FIG. 2, for example, the data storage controller 20 preferably employs an onboard Texas Instruments TMS320C6211 Digital Signal Processor (DSP) to program the onboard Xilinx Spartan Series XCS40XL FPGA upon power-up or system level PCI reset. The onboard boot configuration circuit 28 ensures that from system power-up and/or the assertion of a bus reset (e.g., PCI reset), the DSP 21 is allotted a predetermined amount of time (preferably a minimum of 10 msec) to boot the DSP 21 and load the programmable logic device 22. Because of a potential race condition between either the host computer power-up or assertion of PCI Bus reset and configuration of the programmable logic device 20 (which is used for controlling the boot device and accepting PCI Commands), an "Express Mode" programming mode for configuring the SpartanXL family XCS40XL device is preferably employed. The XCS40XL is factory set to byte-wide Express-Mode programming by setting both the M1/M0 bits of the XCS40XL to 0x0. Further, to accommodate express mode programming of the programmable logic device 22, the DSP 21 is programmed to utilize its serial ports reconfigured as general purpose I/O. However, after the logic device 22 is programmed, the DSP 21 may then reconfigure its serial ports for use with other devices. Advantageously, using the same DSP ports for multiple purposes affords greater flexibility while minimizing hardware resources and thus reducing product cost.

The volatile nature of the logic device 22 effectively affords the ability to have an unlimited number of hardware interfaces. Any number of programs for execution by the programmable logic device 22 can be kept in an accessible memory location (EPROM, hard disk, or other storage device). Each program can contain new disk interfaces, interface modes or subsets thereof. When necessary, the DSP 21 can clear the interface currently residing in the logic device 22 and reprogram it with a new interface. This feature allows the data storage controller 20 to have compatibility with a large number of interfaces while minimizing hardware resources and thus reducing product cost.

A preferred protocol for programming the programmable logic device can be summarized in the following steps: (1) Clearing the configuration memory; (2) Initialization; (3) Configuration; and (4) Start-Up. When either of three events occur: the host computer is first powered-up or a power failure and subsequent recovery occurs (cold boot), or a front panel computer reset is initiated (warm boot), the host computer asserts RST# (reset) on the PCI Bus. As noted above, the data storage controller 20 preferably comprises a boot configuration circuit 28 that senses initial host computer power turn-on and/or assertion of a PCI Bus Reset ("PCI RST#"). It is important to note that assuming the data storage controller 20 is utilized in the computer boot-up sequence, it should be available exactly 5 clock cycles after the PCI RST# is deasserted, as per PCI Bus Specification Revision 2.2. While exact timings vary from computer to computer, the typical PCI bus reset is asserted for approximately 200 msec from initial power turn-on.

In general, PCI RST# is asserted as soon as the computer's power exceeds a nominal threshold of about 1 volt (although this varies) and remains asserted for 200 msec thereafter. Power failure detection of the 5 volt or 3.3 volt bus typically resets the entire computer as if it is an initial power-up event (i.e., cold boot). Front panel resets (warm boots) are more troublesome and are derived from a debounced push-button switch input. Typical front panel reset times are a minimum of 20 msec, although again the only governing specification limit is 1 msec reset pulse width.

As discussed in detail below, it may not be necessary to reload the programmable logic device 22 each time the DSP is reset. The boot configuration circuit 20 preferably comprises a state machine output signal that is readable by the DSP 21 to ascertain the type of boot process requested. For example, with a front-panel reset (warm boot), the power remains stable on the PCI Bus, thus the programmable logic device 22 should not require reloading.

Figure 6A:
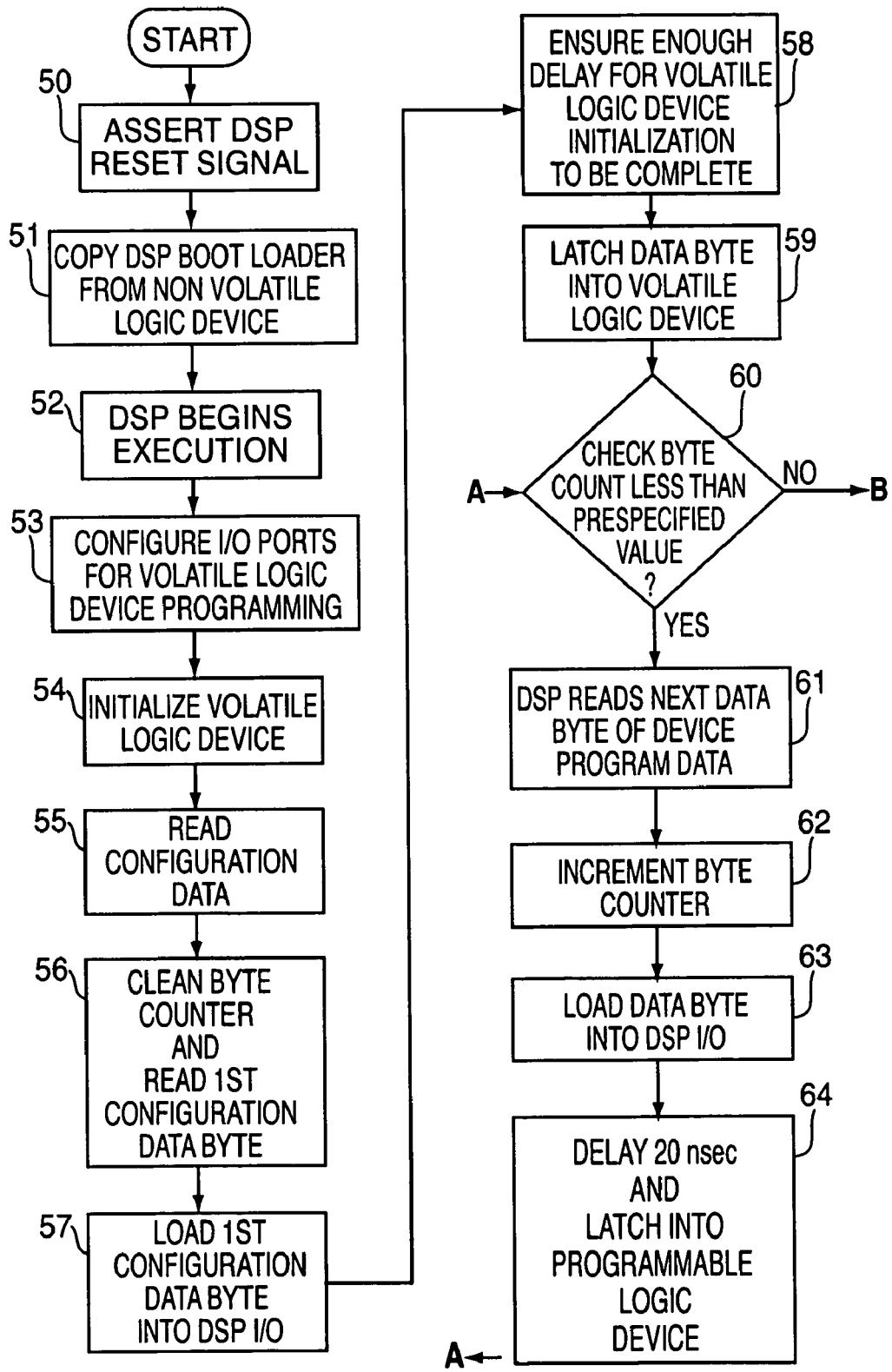
FIGS. 6a and 6b comprise a flow diagram of a method for initializing a data storage controller according to one aspect of the present invention.

Referring now to FIG. 6, a flow diagram illustrates a method for initializing the programmable logic device 22 according to one aspect of the invention. In the following discussion, it is assumed that the programmable logic device 22 is always reloaded, regardless of the type of boot process. Initially, in FIG. 6a, the DSP 21 is reset by asserting a DSP reset signal (step 50). Preferably, the DSP reset signal is generated by the boot circuit configuration circuit 28 (as described in the above-incorporated U.S. Ser. No. 09/775,897 While the DSP reset signal is asserted (e.g., active low), in reset and is initialized to a prescribed state. Upon deassertion of the DSP Reset signal, the logic code for the DSP (referred to as the "boot loader") is copied from the non-volatile logic device 24 into memory residing in the DSP 21 (step 51). This allows the DSP to execute the initialization of the programmable logic device 22. In a preferred embodiment, the lower 1 K bytes of EPROM memory is copied to the first 1 k bytes of DSP's low memory (0x0000 0000 through 0x0000 03FF). As noted above, the memory mapping of the DSP 21 maps the CE1 memory space located at 0x9000 0000 through 0x9001 FFFF with the OTP EPROM. In a preferred embodiment using the Texas Instrument DSP TMS320c6211GFN-150, this ROM boot process is executed by the EDMA controller of the DSP. It is to be understood, however, that the EDMA controller may be instantiated in the programmable logic device (Xilinx), or shared between the DSP and programmable logic device.

After the logic is loaded in the DSP 21, the DSP 21 begins execution out of the lower 1 K bytes of memory (step 52). In a preferred embodiment, the DSP 21 initializes with at least the functionality to read EPROM Memory (CE1) space. Then, as described above, the DSP preferably configures its serial ports as general purpose I/O (step 53).

Next, the DSP 21 will initialize the programmable logic device 22 using one or more suitable control signals. (step 54). After initialization, the DSP 21 begins reading the configuration data of the programmable logic device 22 from the non-volatile memory 24 (step 55). This process begins with clearing a Data Byte Counter and then reading the first data byte beginning at a prespecified memory location in the non-volatile memory 24 (step 56). Then, the first output byte is loaded into the DSP's I/O locations with LSB at D0 and MSB at D7 (step 57). Before the first byte is loaded to the logic device 22, a prespecified time delay (e.g., 5 usec) is provided to ensure that the logic device 22 has been initialized (step 58). In particular, this time delay should be of a duration at least equal to the internal setup time of the programmable logic device 22 from completion of initialization. Once this time delay has expired, the first data byte in the I/O bus 26 of the DSP 21 is latched into the programmable logic device 22 (step 59).

Next, a determination is made as to whether the Data Byte Counter is less than a prespecified value (step 60). If the Data Byte Counter is less than the prespecified value (affirmative determination in step 60), the next successive data byte for the programmable logic device 22 is read from the non-volatile memory 24 (step 61) and the Data Byte Counter is incremented (step 62).

Next, the read data byte is loaded into the I/O of the DSP (step 63). A time delay of, e.g., 20 nsec is allowed to expire before the data byte is latched to the programmable logic device to ensure that a minimum data set-up time to the programmable logic device 21 is observed (step 64) and the process is repeated (return to step 60). It is to be appreciated that steps 60–64 may be performed while the current data byte is being latched to the programmable logic device. This provides "pipeline" programming of the logic device 22 and minimizes programming duration.

Figure 6B:
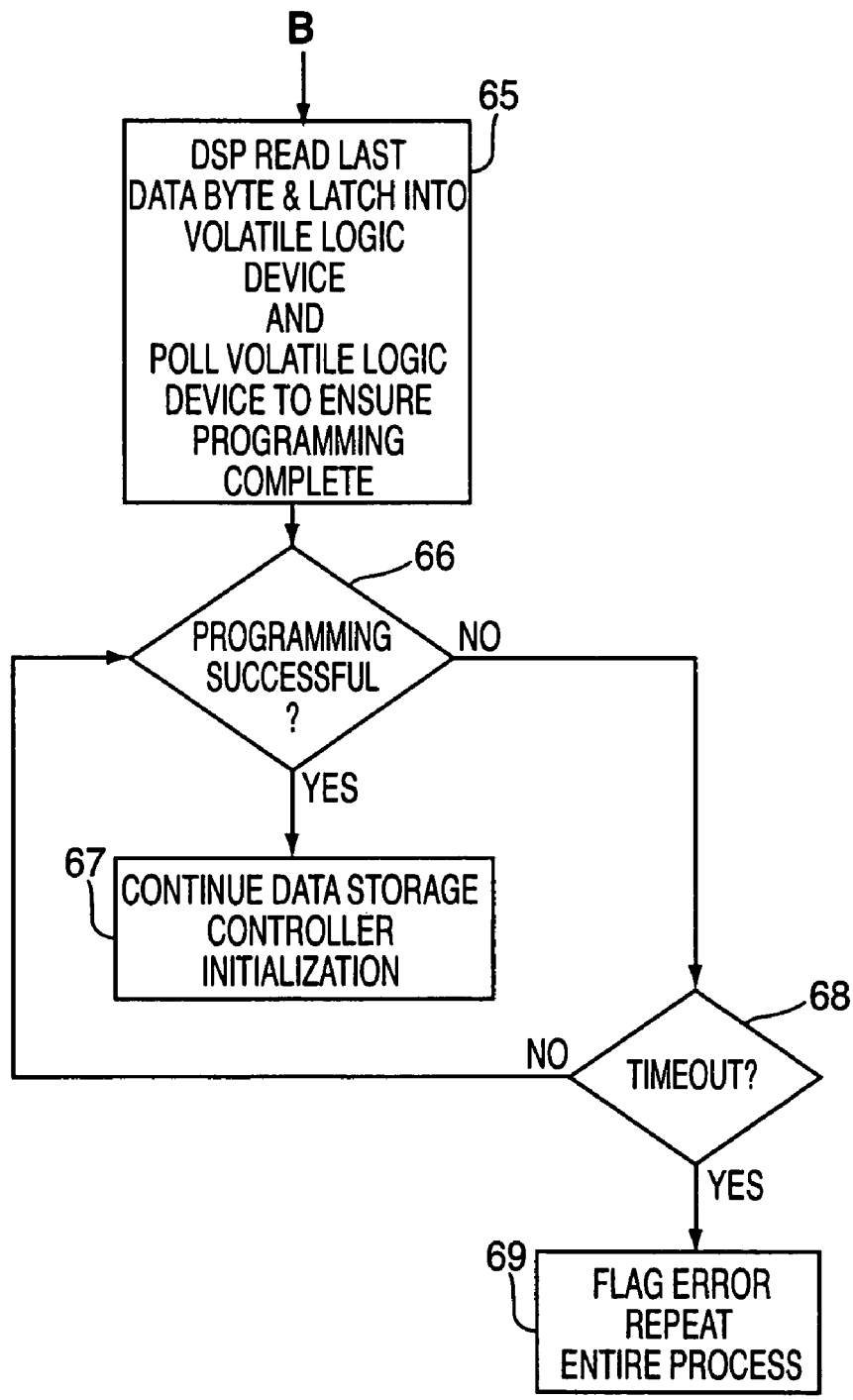

When the Data Byte Counter is not less than the prespecified count value negative determination in step 60), as shown in FIG. 6b, the last data byte is read from the non-volatile memory and latched to the programmable logic device 22, and the DSP 21 will then poll a control signal generated by the programmable logic device 22 to ensure that the programming of the logic device 22 is successful (step 65). If programming is complete (affirmative determination in step 66), the process continues with the remainder of the data storage controller initialization (step 67). Otherwise, a timeout occurs (step 68) and upon expiration of the timeout, an error signal is provided and the programming process is repeated (step 69).

III. Data Storage and Retrieval Protocols

A detailed discussion of operational modes of a data storage controller will now be provided with reference to the embodiment of FIG. 2 (although it is to be understood that the following discussion is applicable to all the above-described embodiments). The data storage controller 20 utilizes a plurality of commands to implement the data storage, retrieval, and disk maintenance functions described herein. Each command preferably comprises eight thirty-two bit data words stored and transmitted in little endian format. The commands include: Read Disk Data; Write Disk Data; and Copy Disk Data, for example. For example, a preferred format for the "Read Disk Data" command is:

| 31 16 | 15 8 | 7 0 | |
|---|---|---|---|
| Command Packet Number 0000h to FFFFh | Command Type 00h | Command Parameters (00h) | 00h |
| Starting Block Address (Least Significant Word) ||| 04h |
| Starting Block Address (Most Significant Word) ||| 08h |
| Number of Blocks (Least Significant Word) ||| 0Ch |
| Number of Blocks (Most Significant Word) ||| 10h |
| Destination Address (Least Significant Word) ||| 14h |
| Destination Address (Most Significant Word) ||| 18h |
| Checksum || Reserved | 1Ch |

The host computer commands the data storage controller 20 over the PCI Bus 16, for example. Upon computer power-up or reset, the host computer issues a PCI Bus Reset with a minimum pulse width of 100 msec (in accordance with PCI Bus Specification Revision 2.2). Upon completion of the PCI Bus reset, the data storage controller 20 is fully initialized and waiting for completion of the PCI configuration cycle. Upon completion of the PCI configuration cycles, the data storage controller will wait in an idle state for the first disk command.

During operation, the host operating system may issue a command to the data storage controller 20 to store, retrieve, or copy specific logical data blocks. Each command is transmitted over the PCI Bus 16 at the Address assigned to the Base Address Register (BAR) of the data storage controller 20.

The commands issued by the host system to the data storage controller and the data transmitted to and from the data storage controller are preferably communicated via a 32 bit, 33 MHz, PCI Data Bus. As noted above, the PCI Interface is preferably housed within the onboard Xilinx Spartan XCS40XL-5 40,000 field programmable gate array which instantiates a PCI 32, 32 Bit, 33 MHz PCI Bus Interface (as per PCI Bus Revision 2.2).

The PCI Bus interface operates in Slave Mode when receiving commands and as a Bus Master when reading or writing data. The source and destination for all data is specified within each command packet. When setting up data transfers, the Enhanced Direct Memory Access (EDMA) Controller of the DSP (or the Xilinx) utilizes two Control Registers, a 16 Word Data Write to PCI Bus FIFO, a 16 Word Data Read From PCI Bus FIFO, and a PCI Data Interrupt (PCIDATINT). The 32 Bit PCI Address Register holds either the starting Source Address for data storage controller Disk Writes where data is read from the PCI Bus, or the starting Destination Address for data storage controller Disk Reads where data is written to the PCI Bus. The second control register is a PCI Count Register that specifies the direction of the data transfer along with the number of 32 bit Data words to be written to or from the PCI bus.

Data is written to the PCI Bus from the DSP via a 16 Word PCI Data Write FIFO located within a prespecified address range. Data writes from the DSP to anywhere within the address range place that data word in the next available location within the FIFO. Data is read from the PCI Bus to the DSP via a 16 Word PCI Data Read FIFO located within a prespecified address range and data read by the DSP from anywhere within this address range provides the next data word from the FIFO.

After completion of the Xilinx initialization by the DSP and subsequent negation of the PCI Bus Reset signal (RST#) by the host computer's PCI Bridge, the data storage controller is ready to accept commands from the host computer via the PCI Bus. When accepting commands it should be noted that the data storage controller is a PCI Target (Slave) Device. Commands are preferably fixed in length at exactly 8 (thirty-two bit) words long. Commands are written from the host computer to the data storage controller via the PCI Bus utilizing the data storage controller's Base Address Register 0 (BAR0). The PCI Bus Reset initially sets the Command FIFO's Counter to zero and also signals the Xilinx's PCI Bus State Controller that the Command FIFO is empty and enable to accept a command.

Whenever a data write occurs within the valid data range of BAR0, the data word is accepted from PCI Bus and placed in the next available memory position within the Command FIFO. When the last of the 8 thirty-two bit data words is accepted by the PCI Bus (thus completing the command, i.e. last word for the command FIFO to be full), the PCI Bus State Controller is automatically set to Target Abort (within same PCI Transaction) or Disconnect Without Data for all subsequent PCI transactions that try to writes to BAR0. This automatic setting is the responsibility of the Xilinx PCI Data Interface.

The PCI Command FIFO State Controller then asserts the Command Available Interrupt to the DSP. The DSP services the Command Available Interrupt by reading the command data from a prespecified address range. It should be noted that the command FIFO is read sequentially from any data access that reads data within such address range. It is the responsibility of the DSP to understand that the data is read sequentially from any order of accesses within the data range and should thus be stored accordingly.

Upon completion of the Command Available Interrupt Service Routine the DSP executes a memory read or write to desired location within the PCI Control Register Space mapped into the DSP's CE3 (Xilinx) memory space. This resets the Command FIFO Counter back to zero. Next, the DSP executes a memory read or write to location in the DSP Memory Space that clears the Command Available Interrupt. Nested interrupts are not possible since the PCI Bus State Machine is not yet able to accept any Command Data at BAR0. Once the Command Available Interrupt routine has cleared the interrupt and exited, the DSP may then enable the PCI State Machine to accept a new command by reading or writing to PCI Command Enable location within the PCI Command FIFO Control Register Space.

A preferred architecture has been selected to enable the data storage controller to operate on one command at a time or to accept multiple prioritized commands in future implementations. Specifically, the decoupling of the Command Available Interrupt Service Routine from the PCI State Machine that accepts Commands at BAR0 enables the DSP's "operating system kernel" to accept additional commands at any time by software command. In single command operation, a command is accepted, the Command Available Interrupt Cleared, and the Command executed by the data storage controller in PCI Master Mode prior to the enabling of the PCI State machine to accept new commands.

In a prioritized multi-command implementation, the "operating system kernel" may elect to immediately accept new commands or defer the acceptance of new commands based upon any software implemented decision criteria. In one embodiment, the O/S code might only allow a pre-specified number of commands to be queued. In another embodiment, commands might only be accepted during processor idle time or when the DSP is not executing time critical (i.e. highly pipelined) compress/decompress routines. In yet another embodiment, various processes are enabled based upon a pre-emptive prioritized based scheduling system.

As previously stated, the data storage controller retrieves commands from the input command FIFO in 8 thirty-two bit word packets. Prior to command interpretation and execution, a command's checksum value is computed to verify the integrity of the data command and associated parameters. If the checksum fails, the host computer is notified of the command packet that failed utilizing the Command Protocol Error Handler. Once the checksum is verified the command type and associated parameters are utilized as an offset into the command "pointer" table or nay other suitable command/data structure that transfers control to the appropriate command execution routine.

Commands are executed by the data storage controller with the data storage controller acting as a PCI Master. This is in direct contrast to command acceptance where the data storage controller acts as a PCI Slave. When acting as a PCI Bus Master, the data storage controller reads or writes data to the PCI Bus utilizing a separate PCI Bus Data FIFO (distinct & apart from the Command FIFO). The PCI Data FIFO is 64 (thirty-two bit) words deep and may be utilized for either data reads or data writes from the DSP to the PCI Bus, but not both simultaneously.

For data to be written from the data storage controller to the Host Computer, the DSP must first write the output data to the PCI Bus Data FIFO. The Data FIFO is commanded to PCI Bus Data Write Mode by writing to a desired location within the Xilinx (CE3) PCI Control Register Space. Upon PCI Bus Reset the default state for the PCI Data FIFO is write mode and the PCI Data FIFO Available Interrupt is cleared. The PCI Data FIFO Available Interrupt should also be software cleared by writing to a prespecified location. Preferably, the first task for the data storage controller is for system boot-up or application code to be downloaded from disk. For reference, PCI Data Read Mode is commanded by writing to location BFF0 0104. The PCI Bus Reset initializes the Data FIFO Pointer to the first data of the 64 data words within the FIFO. However this pointer should always be explicitly initialized by a memory write to location BFF0 0108. This ensures that the first data word written to the FIFO by the DSP performing the data write anywhere in address range B000 0000 to B000 01FF is placed at the beginning of the FIFO. Each subsequent write to any location within this address range then places one thirty-two bit data word into the next available location within the PCI Data FIFO. The FIFO accepts up to 64 thirty-two bit data words although it should be clearly understood that not all data transfers to and from the PCI Bus will consist of a full FIFO. Counting the number of thirty-two bit data words written to the PCI Data FIFO is the responsibility of the DSP Code. It is envisioned that the DSP will, in general, use 64 word DMA data transfers, thus alleviating any additional processor overhead.

When the data has been transferred from the DSP to the PCI Data FIFO, the PCI Bus Controller also needs the address of the PCI Target along with the number of data words to be transmitted. In the current data storage controller implementation, the PCI Bus Address is thirty-two bits wide, although future PCI bus implementations may utilize multiword addressing and/or significantly larger (64 bit & up) address widths. The single thirty-two bit address word is written by the DSP to memory location aaaa+0x10 in the PCI Control Register Space.

Finally, the PCI Bus Data Write transaction is initiated by writing the PCI Data FIFO word count to a prespecified memory address. The word count value is always decimal 64 or less (0x3F). When the count register is written the value is automatically transferred to the PCI Controller for executing the PCI Bus Master writes.

When the PCI Bus has completed the transfer of all data words within the PCI Data FIFO the PCI Data FIFO Available Interrupt is set. The DSP PCI Data FIFO Available Interrupt handler will then check to see if additional data is waiting or expected to be written to the PCI Data Bus. If additional data is required the interrupt is cleared and the data transfer process repeats. If no additional data is required to be transferred then the interrupt is cleared and the routine must exit to a system state controller. For example, if the command is complete then master mode must be disabled and then slave mode (command mode) enabled—assuming a single command by command execution data storage controller.

For data to be read by the data storage controller from the Host Computer, the DSP must command the PCI Bus with the address and quantity of data to be received.

The PCI Data FIFO is commanded to PCI Bus Data Read Mode by writing to a desired location within the Xilinx (CE3) PCI Control Register Space. Upon PCI Bus Reset the default state for the PCI Data FIFO is Write Mode and the PCI Data FIFO Full Interrupt is cleared. The PCI Data FIFO Full Interrupt should also be cleared via software by writing to such location. The PCI Bus Reset also initializes the PCI Data FIFO Pointer to the first data word of the available 64 data words within the FIFO. However this pointer should always be explicitly initialized by a memory write to prespecified location.

For data to be read from the PCI Bus by the data storage controller, the Xilinx PCI Bus Controller requires the address of the PCI Target along with the number of data words to be received. In the current data storage controller implementation, the PCI Bus Address is thirty-two bits wide, although future PCI bus implementations may utilize multiword addressing and/or significantly larger (64 bit & up) address widths. The single thirty-two bit address word is written by the DSP to prespecified memory location in the PCI Control Register Space.

Finally, the PCI Bus Data Read transaction is initiated by writing the PCI Data FIFO word count to prespecified memory address. The word count value is always decimal 64 or less (0x3F). When the count register is written the value is automatically transferred to the PCI Controller for executing the PCI Bus Master Read.

When the PCI Bus has received all the requested data words PCI Data FIFO Full Interrupt is set. The DSP PCI Data FIFO Full Interrupt handler will then check to see if additional data is waiting or expected to be read from the PCI Data Bus. If additional data is required the interrupt is cleared and the data receipt process repeats. If no additional data is required to be transferred, then the interrupt is cleared and the routine exits to a system state controller. For example, if the command is complete then master mode must be disabled and then slave mode (command mode) enabled—assuming a single command by command execution data storage controller.

It is clearly understood that there are other techniques for handling the PCI Data transfers. The current methodology has been selected to minimize the complexity and resource utilization of the Xilinx Gate Array. It should also be understood that the utilization of asynchronous memory reads and writes to initialize system states and synchronize events at a software level aids in both hardware and system level debug at the expense of increase software overhead. Subsequent embodiments of the gate array may automate resource intensive tasks if system level performance mandates.

IV. Memory Bandwidth Allocation

The onboard cache of the data storage controller is shared by the DSP, Disk Interface, and PCI Bus. The best case, maximum bandwidth for the SDRAM memory is 70 megawords per second, or equivalently, 280 megabytes per second. The 32 bit PCI Bus interface has a best case bandwidth of 132 megabytes per second, or equivalently 33 megawords per second. In current practice, this bandwidth is only achieved in short bursts. The granularity of PCI data bursts to/from the data storage controller is governed by the PCI Bus interface data buffer depth of sixteen words (64 bytes). The time division multiplexing nature of the current PCI Data Transfer Buffering methodology cuts the sustained PCI bandwidth down to 66 megabytes/second.

Data is transferred across the ultraDMA disk interface at a maximum burst rate of 66 megabytes/second. It should be noted that the burst rate is only achieved with disks that contain onboard cache memory. Currently this is becoming more and more popular within the industry. However assuming a disk cache miss, the maximum transfer rates from current disk drives is approximately six megabytes per second. Allotting for technology improvements over time, the data storage controller has been designed for a maximum sustained disk data rate of 20 megabytes second (5 megawords/second). A design challenge is created by the need for continuous access to the SDRAM memory. Disks are physical devices and it is necessary to continuously read data from disk and place it into memory, otherwise the disk will incur a fall rotational latency prior to continuing the read transaction. The maximum SDRAM access latency that can be incurred is the depth of the each of the two disk FIFO s or sixteen data. Assuming the FIFO is sixteen words deep the maximum latency time for emptying the other disk FIFO and restoring it to the disk interface is sixteen words at 5 megawords per second or (16×3.2 usec)=1 usec. Each EMIF clock cycle is 14.2857 nsec, thus the maximum latency translates to 224 clock cycles. It should be noted that transfers across the disk interface are 16 bits wide, thus the FPGA is required to translate 32 bit memory transfers to 16 bit disk transfers, and vice-versa.

The DSP services request for its external bus from two requestors, the Enhanced Direct Memory Access (EDMA) Controller and an external shared memory device controller. The DSP can typically utilize the full 280 megabytes of bus bandwidth on an 8 k through 64 K byte (2 k word through 16 k word) burst basis. It should be noted that the SDRAM memory is not utilized for interim processing storage, and as such bandwidth is only utilized in direct proportion to disk read and write commands.

For a single read from disk transaction data is transferred from and DMA transfer into SDRAM memory. This data is then DMA transferred by the DSP into onboard DSP memory, processed, and re transferred back to SDRAM in decompressed format (3 words for every one word in). Finally the data is read from SDRAM by the PCI Bus Controller and placed into host computer memory. This equates to eight SDRAM accesses, one write from disk, one read by the DSP, three writes by the DSP and three by the PCI Bus. Disk write transactions similarly require eight SDRAM accesses, three from the PCI, three DSP reads, one DSP write, and one to the disk.

Neglecting overhead for setting up DMA transfers, arbitration latencies, and memory wait states for setting up SDRAM transactions, the maximum DSRA theoretical SDRAM bandwidth limit for disk reads or writes is 280/8 megabytes second or 35 megabytes second. It should be noted that the best case allocation of SDRAM bandwidth would be dynamic dependent upon the data compression and decompression ratios. Future enhancements to the data storage controller will utilize a programmable timeslice system to allocate SDRAM bandwidth, however this first embodiment will utilize a fixed allocation ratio as follows:

If all three requesters require SDRAM simultaneously:

| | |
|---|---|
| PCI Bus Interface | 3/8 |
| DSP Accesses | 4/8 |
| UltraDMA Disk Interface | 1/8 |

If only the PCI Bus and DSP require SDRAM:

| | |
|---|---|
| PCI Bus Interface | 4/8 |
| DSP Accesses | 4/8 |

If only the DSP and Disk require SDRAM:

| | |
|---|---|
| DSP Accesses | 6/8 |
| UltraDMA Disk Interface | 2/8 |

If only the PCI Bus and Disk require SDRAM:

| | |
|---|---|
| PCI Bus Interface | 6/8 |
| UltraDMA Disk Interface | 2/8 |

If only one device requires SDRAM it receives the full SDRAM bandwidth. It should be noted that different ratios may be applied based upon the anticipated or actual compression and/or decompression ratios. For example in the case of all three requestors active the following equation applies. Assume that data storage accelerator achieves a compression ratio A:B for example 3:1. The Numerator and denominators of the various allocations are defined as follows:

| | |
|---|---|
| PCI Bus Interface | A/K |
| DSP Accesses | (A+B)/K |
| UltraDMA Disk Interface | B/K |

Where Further define a sum K equal to the sum of the numerators of the PCI Bus interface fraction, the DSP Access fraction, and the UltraDMA Disk Interfaces, i.e. K=2(A+B). Similarly:

If only the PCI Bus and DSP require SDRAM:

| PCI Bus Interface | (A+B)/K |
|---|---|
| DSP Accesses | (A+B)/K |

If only the DSP and Disk require SDRAM:

| DSP Accesses | 2A/K |
|---|---|
| UltraDMA Disk Interface | 2B/K |

If only the PCI Bus and Disk require SDRAM:

| PCI Bus Interface | 2A/K |
|---|---|
| UltraDMA Disk Interface | 2B/K |

It should be noted that the resultant ratios may all be scaled by a constant in order to most effectively utilize the bandwidths of the internal busses and external interfaces. In addition each ratio can be scale by an adjustment factor based upon the time required to complete individual cycles. For example if PCI Bus interface takes 20% longer than all other cycles, the PCI time slice should be adjusted longer accordingly.

V. Instant Boot Device for Operating System, Application Program and Loading

Typically, with conventional boot device controllers, after reset, the boot device controller will wait for a command over the computer bus (such as PCI). Since the boot device controller will typically be reset prior to bus reset and before the computer bus starts sending commands, this wait period is unproductive time. The initial bus commands inevitably instruct the boot device controller to retrieve data from the boot device (such as a disk) for the operating system. Since most boot devices are relatively slow compared to the speed of most computer busses, a long delay is seen by the computer user. This is evident in the time it takes for a typical computer to boot.

It is to be appreciated that a data storage controller (having an architecture as described herein) may employ a technique of data preloading to decrease the computer system boot time. Upon host system power-up or reset, the data storage controller will perform a self-diagnostic and program the programmable logic device (as discussed above) prior to completion of the host system reset (e.g., PCI bus reset) so that the logic device can accept PCI Bus commands after system reset. Further, prior to host system reset, the data storage controller can proceed to pre-load the portions of the computer operating system from the boot device (e.g., hard disk) into the on-board cache memory. The data storage controller preloads the needed sectors of data in the order in which they will be needed. Since the same portions of the operating system must be loaded upon each boot process, it is advantageous for the boot device controller to preload such portions and not wait until it is commanded to load the operating system. Preferably, the data storage controller employs a dedicated IO channel of the DSP (with or without data compression) to pre-load computer operating systems and applications.

Once the data is preloaded, when the computer system bus issues its first read commands to the data storage controller seeking operating system data, the data will already be available in the cache memory of the data storage controller. The data storage controller will then be able to instantly start transmitting the data to the system bus. Before transmission to the bus, if the data was stored in compressed format on the boot device, the data will be decompressed. The process of preloading required (compressed) portions of the operating system significantly reduces the computer boot process time.

In addition to preloading operating system data, the data storage controller could also preload other data that the user would likely want to use at startup. An example of this would be a frequently used application such as a word processor and any number of document files.

There are several techniques that may be employed in accordance with the present invention that would allow the data storage controller to know what data to preload from the boot device. One technique utilizes a custom utility program that would allow the user to specify what applications/data should be preloaded.

Figure 7A:
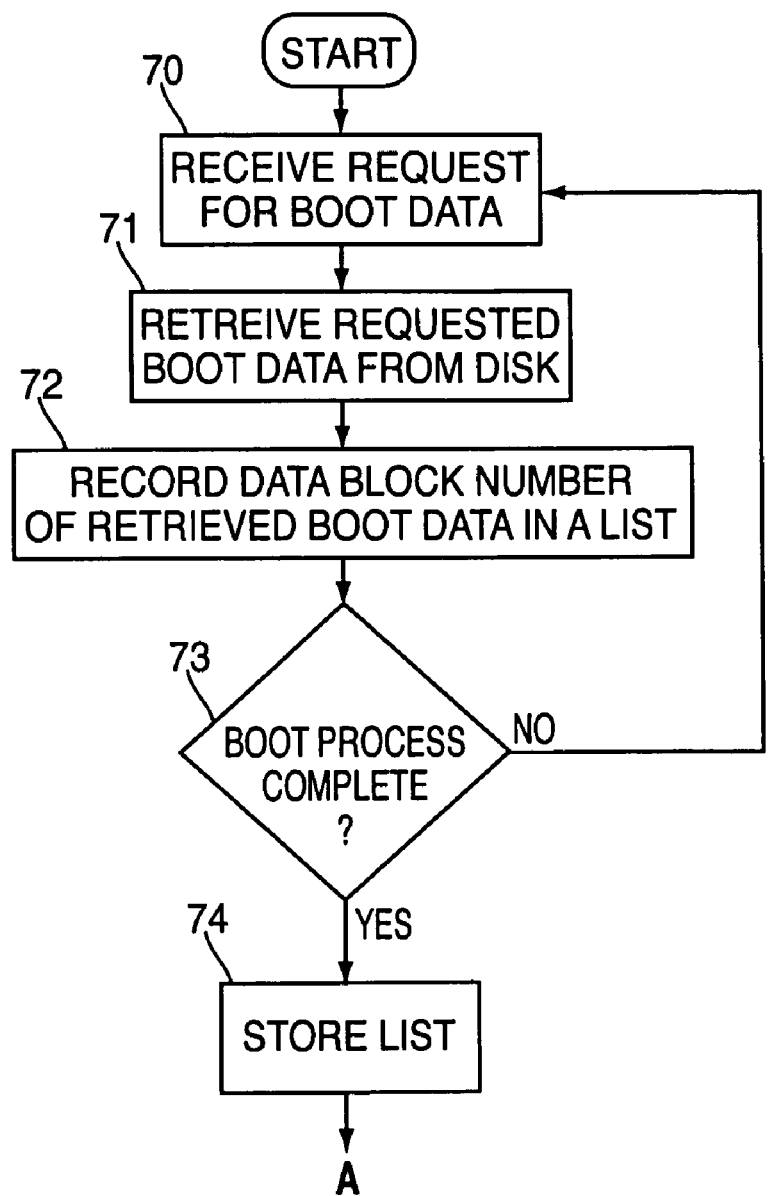
FIGS. 7a and 7b comprise a flow diagram of a method for providing accelerated loading of an operating system and/or application programs upon system boot, according to one aspect of the present invention.
Figure 7B:
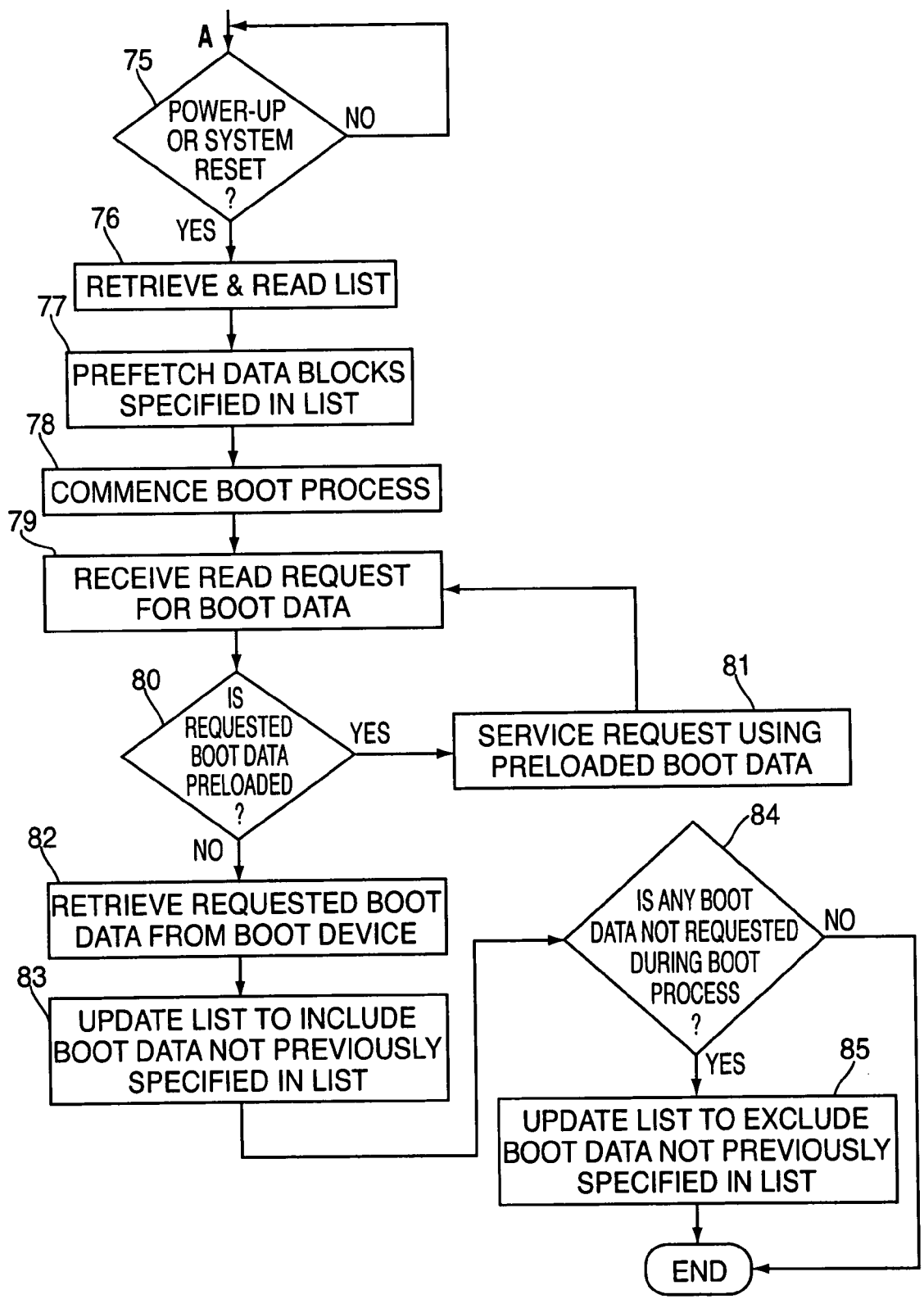

Another technique (illustrated by the flow diagram of FIGS. 7a and 7b) that may be employed comprises an automatic process that requires no input from the user. With this technique, the data storage controller maintain a list comprising the data associated with the first series of data requests received by the data storage controller by the host system after a power-on/reset. In particular, referring to FIG. 7a, during the computer boot process, the data storage controller will receive requests for the boot data (step 70). In response, the data storage controller will retrieve the requested boot data from the boot device (e.g., hard disk) in the local cache memory (step 71). For each requested data block, the data storage controller will record the requested data block number in a list (step 72). The data storage controller will record the data block number of each data block requested by the host computer during the boot process (repeat steps 70–72). When the boot process is complete (affirmative determination in step 73), the data storage controller will store the data list on the boot device (or other storage device) (step 74).

Then, upon each subsequent power-on/reset (affirmative result in step 75), the data storage controller would retrieve and read the stored list (step 76) and proceed to preload the boot data specified on the list (i.e., the data associated with the expected data requests) into the onboard cache memory (step 77). It is to be understood that the depending on the resources of the given system (e.g., memory, etc.), the preloading process may be completed prior to commencement of the boot process, or continued after the boot process begins (in which case booting and preloading are performed simultaneously).

When the boot process begins (step 78) (i.e., the storage controller is initialized and the system bus reset is deasserted), the data storage controller will receive requests for boot data (step 79). If the host computer issues a request for boot data that is pre-loaded in the local memory of the data storage controller (affirmative result in step 80), the request is immediately serviced using the preloaded boot data (step 81). If the host computer issues a request for boot data that is not preloaded in the local memory of the data storage controller (negative determination in step 80), the controller will retrieve the requested data from the boot device, store the data in the local memory, and then deliver the requested boot data to the computer bus (step 82). In addition, the data storage controller would update the boot data list by recording any changes in the actual data requests as compared to the expected data requests already stored in the list (step 83). Then, upon the next boot sequence, the boot device controller would pre-load that data into the local cache memory along with the other boot data previously on the list.

Further, during the boot process, if no request is made by the host computer for a data block that was pre-loaded into the local memory of the data storage controller (affirmative result in step 84), then the boot data list will be updated by removing the non-requested data block from the list (step 85). Thereafter, upon the next boot sequence, the data storage controller will not pre-load that data into local memory.

VI. Quick Launch for Operating System, Application Program, and Loading

It is to be appreciated that the data storage controller (having an architecture as described herein) may employ a technique of data preloading to decrease the time to load application programs (referred to as "quick launch"). Conventionally, when a user launches an application, the file system reads the first few blocks of the file off the disk, and then the portion of the loaded software will request via the file system what additional data it needs from the disk. For example, a user may open a spreadsheet program, and the program may be configured to always load a company spreadsheet each time the program is started. In addition, the company spreadsheet may require data from other spreadsheet files.

In accordance with the present invention, the data storage controller may be configured to "remember" what data is typically loaded following the launch of the spreadsheet program, for example. The data storage controller may then proceed to preload the company spreadsheet and all the necessary data in the order is which such data is needed. Once this is accomplished, the data storage controller can service read commands using the preloaded data. Before transmission to the bus, if the preloaded data was stored in compressed format, the data will be decompressed. The process of preloading (compressed) program data significantly reduces the time for launching an application.

Preferably, a custom utility program is employed that would allow the user to specify what applications should be made ready for quick launch.

Figure 8A:
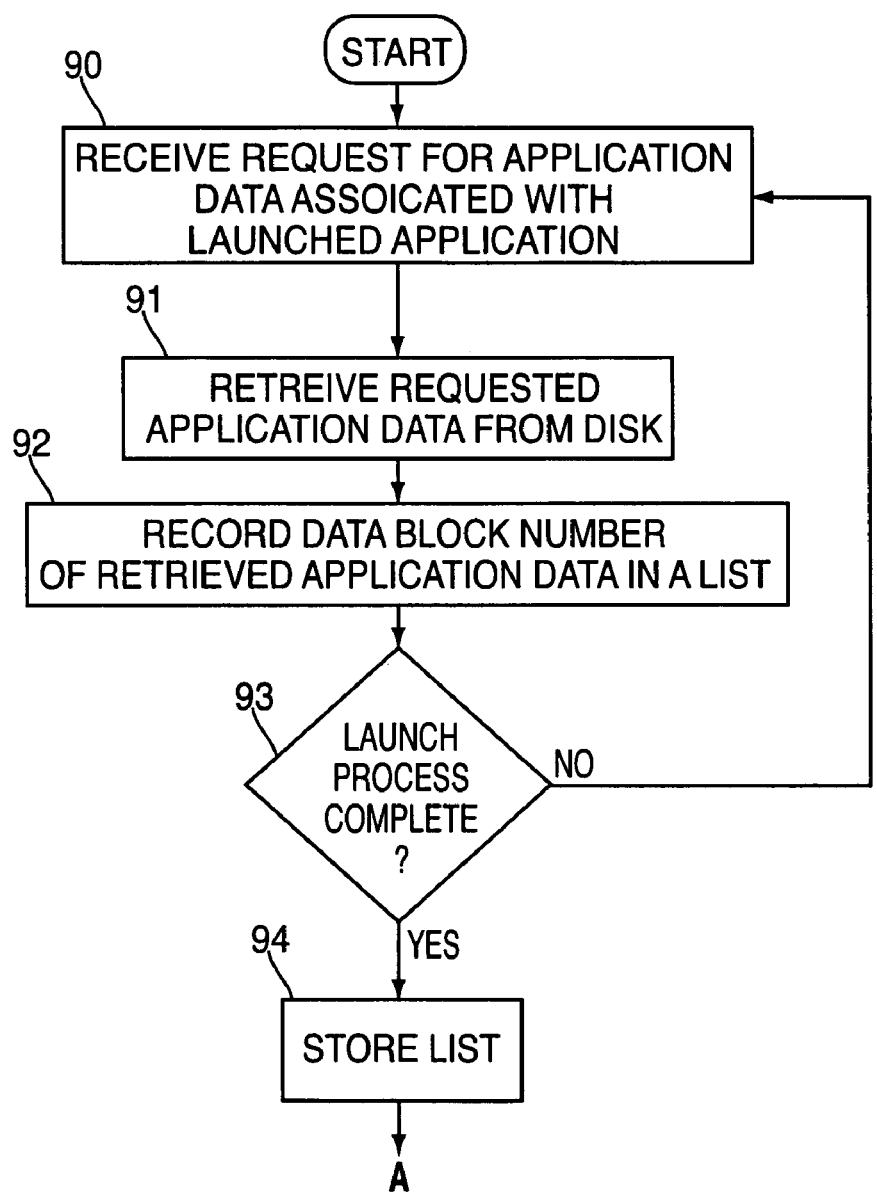
FIGS. 8a and 8b comprise a flow diagram of a method for providing accelerated loading of application programs according to one aspect of the present invention.
Figure 8B:
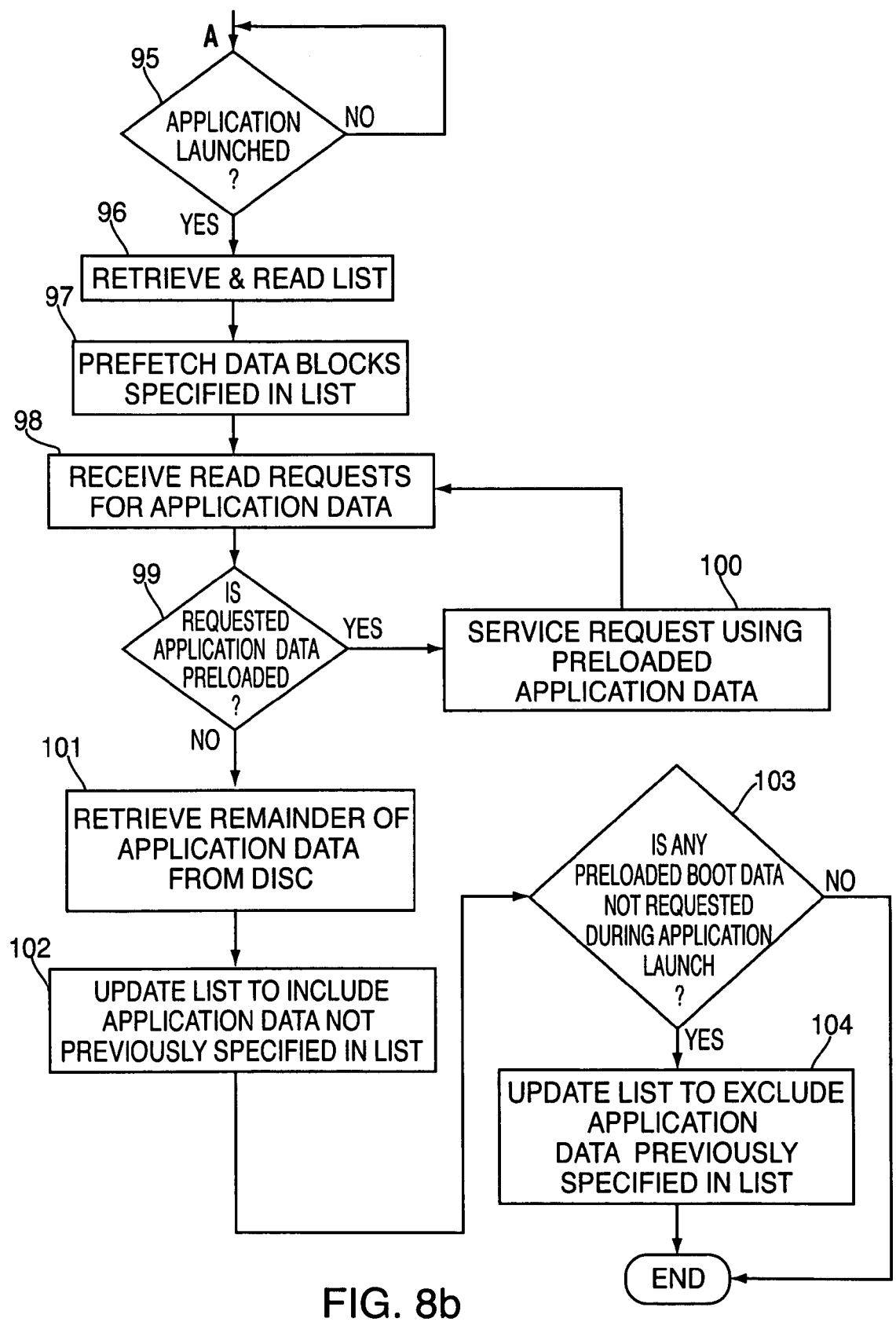

FIGS. 8*a* and 8*b* comprise a flow diagram of a quick launch method according to one aspect of the present invention. With this technique, the data storage controller maintains a list comprising the data associated with launching an application. In particular, when an application is first launched, the data storage controller will receive requests for the application data (step 90). In response, the data storage controller will retrieve the requested application data from memory (e.g., hard disk) and store it in the local cache memory (step 91). The data storage controller will record the data block number of each data block requested by the host computer during the launch process (step 92). When the launch process is complete (affirmative determination in step 93), the data storage controller will store the data list in a designated memory location (step 94).

Then, referring to FIG. 8*b*, upon each subsequent launch of the application (affirmative result in step 95), the data storage controller would retrieve and read the stored list (step 96) and then proceed to preload the application data specified on the list (i.e., the data associated with the expected data requests) into the onboard cache memory (step 97). During the application launch process, the data storage controller will receive requests for application data (step 98). If the host computer issues a request for application data that is pre-loaded in the local memory of the data storage controller (affirmative result in step 99), the request is immediately serviced using the preloaded data (step 100). If the host computer issues a request for application data that is not preloaded in the local memory of the data storage controller (negative result in step 99), the controller will retrieve the requested data from the hard disk memory, store the data in the local memory, and then deliver the requested application data to the computer bus (step 101). In addition, the data storage controller would update the application data list by recording any changes in the actual data requests as compared to the expected data requests already stored in the list (step 102).

Further, during the launch process, if no request is made by the host computer for a data block that was pre-loaded into the local memory of the data storage controller (affirmative result in step 103), then the application data list will be updated by removing the non-requested data block from the list (step 104). Thereafter, upon the next launch sequence for the given application, the data storage controller will not pre-load that data into local memory.

It is to be understood that the quick boot and quick launch methods described above are preferably implemented by a storage controller according to the present invention and may or may not utilize data compression/decompression by the DSP. However, it is to be understood that the quick boot and quick launch methods may be implemented by a separate device, processor, or system, or implemented in software.

VII. Content Independent Data Compression

It is to be understood that any conventional compression/decompression system and method (which comply with the above mentioned constraints) may be employed in the data storage controller for providing accelerated data storage and retrieval in accordance with the present invention. Preferably, the present invention employs the data compression/decompression techniques disclosed in the above-incorporated U.S. Ser. No. 09/210,491.

Figure 9:
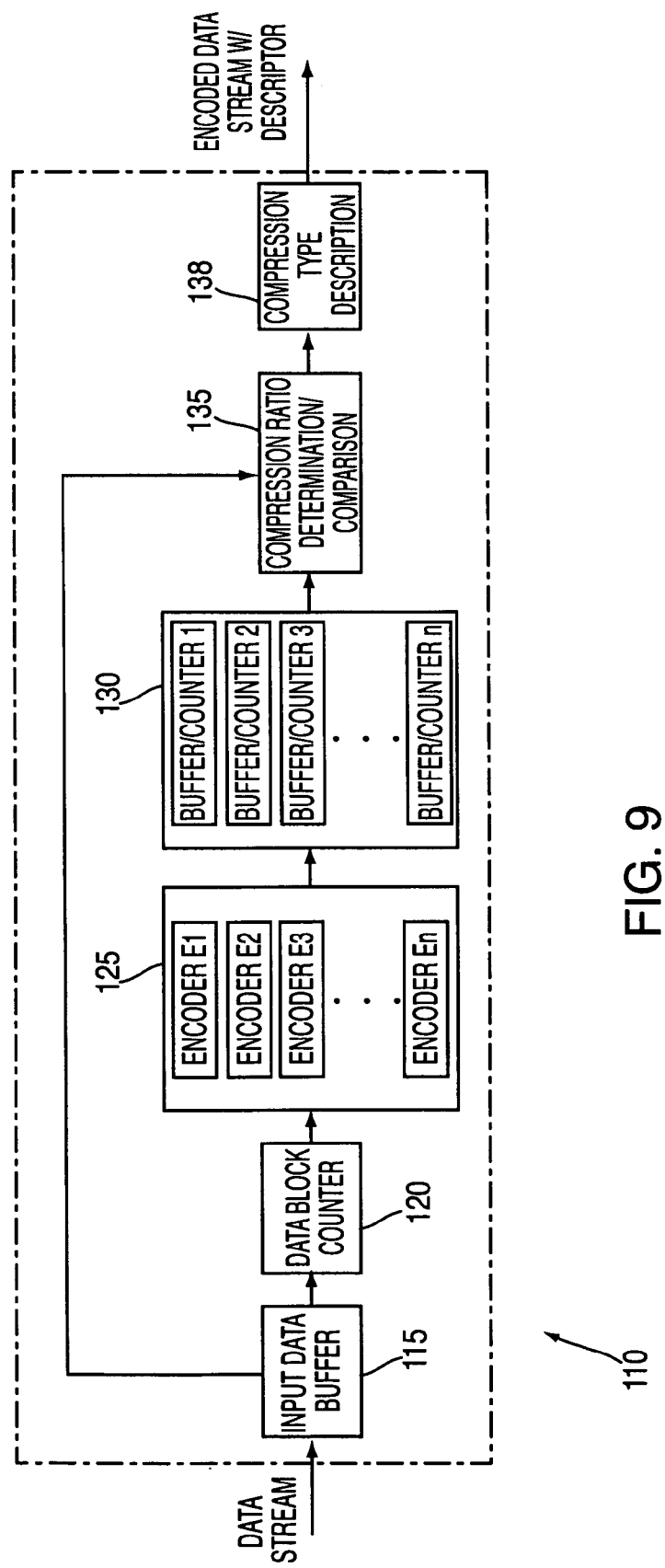
FIG. 9 is a diagram of an exemplary data compression system that may be employed in a data storage controller according to the present invention.

Referring to FIG. 9, a detailed block diagram illustrates an exemplary data compression system 110 that may be employed herein. Details of this data compression system are provided in U.S. Ser. No. 09/210,491. In this embodiment, the data compression system 110 accepts data blocks from an input data stream and stores the input data block in an input buffer or cache 115. It is to be understood that the system processes the input data stream in data blocks that may range in size from individual bits through complete files or collections of multiple files. Additionally, the input data block size may be fixed or variable. A counter 120 counts or otherwise enumerates the size of input data block in any convenient units including bits, bytes, words, and double words. It should be noted that the input buffer 115 and counter 120 are not required elements of the present invention. The input data buffer 115 may be provided for buffering the input data stream in order to output an uncompressed data stream in the event that, as discussed in further detail below, every encoder fails to achieve a level of compression that exceeds an a priori specified minimum compression ratio threshold.

Data compression is performed by an encoder module 125 which may comprise a set of encoders E1, E2, E3 . . . En. The encoder set E1, E2, E3 . . . En may include any number "n" (where n may=1) of those lossless encoding techniques currently well known within the art such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders are preferably selected to provide a broad coverage of existing and future data types.

The encoder module 125 successively receives as input each of the buffered input data blocks (or unbuffered input data blocks from the counter module 120). Data compression is performed by the encoder module 125 wherein each of the encoders E1 . . . En processes a given input data block and outputs a corresponding set of encoded data blocks. It is to be appreciated that the system affords a user the option to enable/disable any one or more of the encoders E1 . . . En prior to operation. As is understood by those skilled in the art, such feature allows the user to tailor the operation of the data compression system for specific applications. It is to be further appreciated that the encoding process may be performed either in parallel or sequentially. In particular, the encoders E1 through En of encoder module 125 may operate in parallel (i.e., simultaneously processing a given input data block by utilizing task multiplexing on a single central processor, via dedicated hardware, by executing on a plurality of processor or dedicated hardware systems, or any combination thereof). In addition, encoders E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block.

A buffer/counter module 130 is operatively connected to the encoder module 125 for buffering and counting the size of each of the encoded data blocks output from encoder module 125. Specifically, the buffer/counter 130 comprises a plurality of buffer/counters BC1, BC2, BC3 . . . BCn, each operatively associated with a corresponding one of the encoders E1 . . . En. A compression ratio module 135, operatively connected to the output buffer/counter 130, determines the compression ratio obtained for each of the enabled encoders E1. . . En by taking the ratio of the size of the input data block to the size of the output data block stored in the corresponding buffer/counters BC1 . . . BCn. In addition, the compression ratio module 135 compares each compression ratio with an a priori-specified compression ratio threshold limit to determine if at least one of the encoded data blocks output from the enabled encoders E1 . . . En achieves a compression that exceeds an a priori-specified threshold. As is understood by those skilled in the art, the threshold limit may be specified as any value inclusive of data expansion, no data compression or expansion, or any arbitrarily desired compression limit. A description module 138, operatively coupled to the compression ratio module 135, appends a corresponding compression type descriptor to each encoded data block which is selected for output so as to indicate the type of compression format of the encoded data block. A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal. If there are no encoded data blocks having a compression ratio that exceeds the compression ratio threshold limit, then the original unencoded input data block is selected for output and a null data compression type descriptor is appended thereto. A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal.

Again, it is to be understood that the embodiment of the data compression engine of FIG. 9 is exemplary of a preferred compression system which may be implemented in the present invention, and that other compression systems and methods known to those skilled in the art may be employed for providing accelerated data storage in accordance with the teachings herein. Indeed, in another embodiment of the compression system disclosed in the above-incorporated U.S. Pat. No. 6,195,024, a timer is included to measure the time elapsed during the encoding process against an a priori-specified time limit. When the time limit expires, only the data output from those encoders (in the encoder module 125) that have completed the present encoding cycle are compared to determine the encoded data with the highest compression ratio. The time limit ensures that the real-time or pseudo real-time nature of the data encoding is preserved. In addition, the results from each encoder in the encoder module 125 may be buffered to allow additional encoders to be sequentially applied to the output of the previous encoder, yielding a more optimal lossless data compression ratio. Such techniques are discussed in greater detail in the above-incorporated U.S. Pat. No. 6,195,024.

Figure 10:
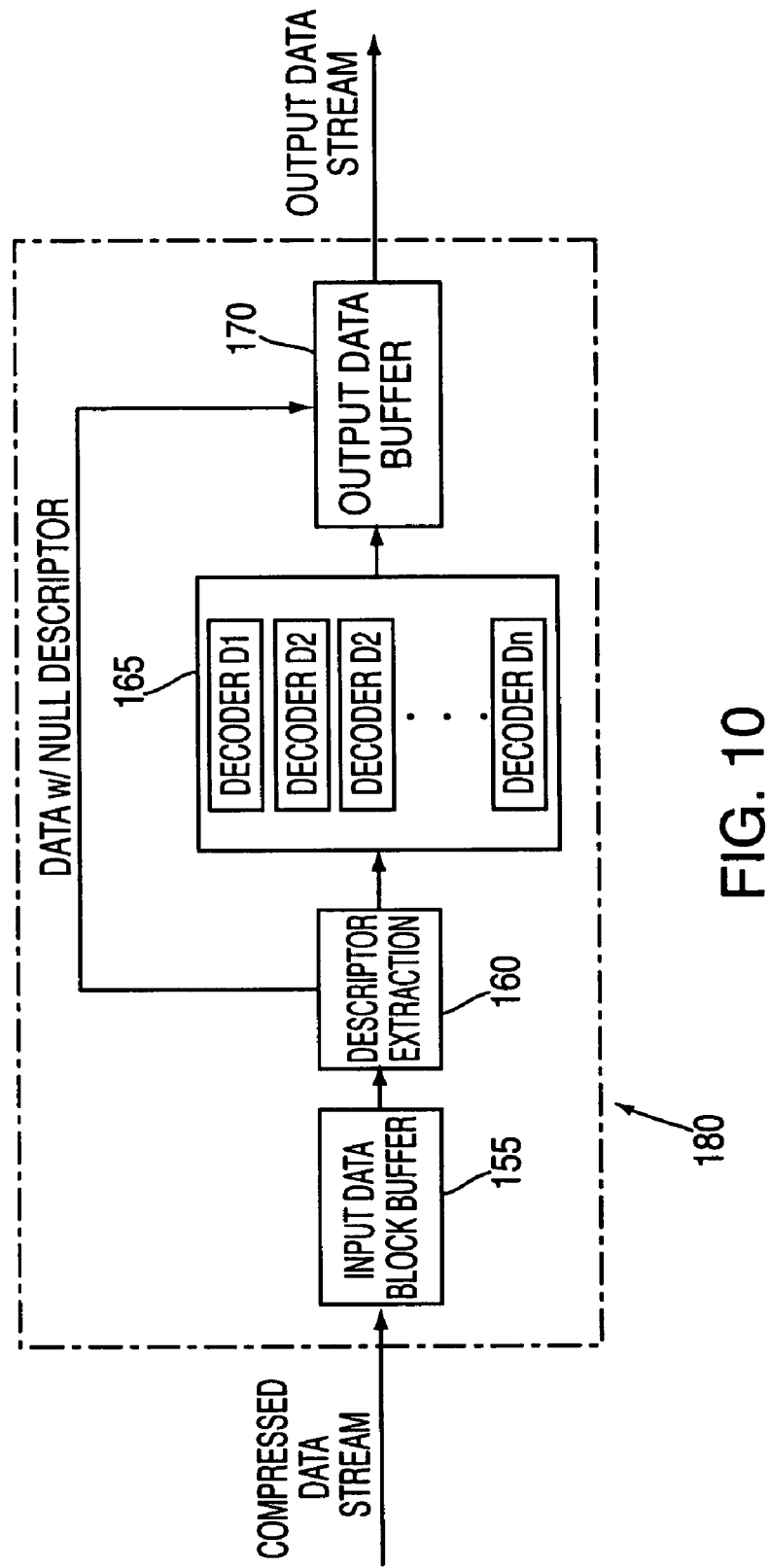
FIG. 10 is a diagram of an exemplary data decompression system that may be employed in a data storage controller according to the present invention.

Referring now to FIG. 10, a detailed block diagram illustrates an exemplary decompression system that may be employed herein or accelerated data retrieval as disclosed in the above-incorporated U.S. Pat. No. 6,195,024. In this embodiment, the data compression engine 180 retrieves or otherwise accepts compressed data blocks from one or more data storage devices and inputs the data via a data storage interface. It is to be understood that the system processes the input data stream in data blocks that may range in size from individual bits through complete files or collections of multiple files. Additionally, the input data block size may be fixed or variable.

The data decompression engine 180 comprises an input buffer 155 that receives as input an uncompressed or compressed data stream comprising one or more data blocks. The data blocks may range in size from individual bits through complete files or collections of multiple files. Additionally, the data block size may be fixed or variable. The input data buffer 55 is preferably included (not required) to provide storage of input data for various hardware implementations. A descriptor extraction module 160 receives the buffered (or unbuffered) input data block and then parses, lexically, syntactically, or otherwise analyzes the input data block using methods known by those skilled in the art to extract the data compression type descriptor associated with the data block. The data compression type descriptor may possess values corresponding to null (no encoding applied), a single applied encoding technique, or multiple encoding techniques applied in a specific or random order (in accordance with the data compression system embodiments and methods discussed above).

A decoder module 165 includes one or more decoders D1 . . . Dn for decoding the input data block using a decoder, set of decoders, or a sequential set of decoders corresponding to the extracted compression type descriptor. The decoders D1 . . . Dn may include those lossless encoding techniques currently well known within the art, including: run length, Huffman, Lempel-Ziv Dictionary Compression, arithmetic coding, data compaction, and data null suppression. Decoding techniques are selected based upon their ability to effectively decode the various different types of encoded input data generated by the data compression systems described above or originating from any other desired source.

As with the data compression systems discussed in U.S. Pat. No. 6,195,024, the decoder module 165 may include multiple decoders of the same type applied in parallel so as to reduce the data decoding time. An output data buffer or cache 170 may be included for buffering the decoded data block output from the decoder module 165. The output buffer 70 then provides data to the output data stream. It is to be appreciated by those skilled in the art that the data compression system 180 may also include an input data counter and output data counter operatively coupled to the input and output, respectively, of the decoder module 165. In this manner, the compressed and corresponding decompressed data block may be counted to ensure that sufficient decompression is obtained for the input data block.

Again, it is to be understood that the embodiment of the data decompression system 180 of FIG. 10 is exemplary of a preferred decompression system and method which may be implemented in the present invention, and that other data decompression systems and methods known to those skilled in the art may be employed for providing accelerated data retrieval in accordance with the teachings herein.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for providing accelerated loading of an operating system, comprising the steps of:
    maintaining a list of boot data used for booting a computer system;
    initializing a central processing unit of the computer system;
    preloading the boot data into a cache memory prior to completion of initialization of the central processing unit of the computer system, wherein preloading the boot data comprises accessing compressed boot data from a boot device; and
    servicing requests for boot data from the computer system using the preloaded boot data after completion of initialization of the central processing unit of the computer system, wherein servicing requests comprises accessing compressed boot data from the cache and decompressing the compressed boot data at a rate that increases the effective access rate of the cache.

2. The method of claim 1, wherein the boot data comprises program code associated with one of an operating system of the computer system, an application program, and a combination thereof.

3. The method of claim 1, wherein the preloading is performed by a data storage controller connected to the boot device.

4. The method of claim 1, further comprising updating the list of boot data.

5. The method of claim 4, wherein the step of updating comprises adding to the list any boot data requested by the computer system not previously stored in the list.

6. The method of claim 4, wherein the step of updating comprises removing from the list any boot data previously stored in the list and not requested by the computer system.

7. A system for providing accelerated loading of an operating system of a host system comprising:
    a digital signal processor (DSP) or controller;
    a cache memory device; and
    a non-volatile memory device, for storing logic code associated with the DSP or controller, wherein the logic code comprises instructions executable by the DSP or controller for maintaining a list of boot data used for booting the host system, for preloading the compressed boot data into the cache memory device prior to completion of initialization of the central processing unit of the host system, and for decompressing the preloaded compressed boot data, at a rate that increases the effective access rate of the cache, to service requests for boot data from the host system after completion of initialization of the central processing unit of the host system.

8. The system of claim 7, wherein the logic code in the non-volatile memory device further comprises program instructions executable by the DSP or controller for maintaining a list of application data associated with an application program; preloading the application data upon launching the application program, and servicing requests for the application data from the host system using the preloaded application data.

9. The method of claim 1, further comprising:
    maintaining a list of application data associated with an application program;
    preloading the application data into the cache memory prior to completion of initialization of the central processing unit of the computer system, wherein preloading the application data comprises accessing compressed application data from a boot device; and
    servicing requests for application data from the computer system using the preloaded application data after completion of initialization of the central processing unit of the computer system, wherein servicing requests comprises accessing compressed application data from the cache and decompressing the compressed application data.

10. The method of claim 1, further comprising a data compression engine for compressing, wherein the compressing provides the compressed boot data and the data compression engine provides the compressed boot data to the boot device.

11. The method of claim 1, wherein the decompressing is provided by a data compression engine.

12. The method of claim 1, further comprising a data compression engine for compressing, wherein the compressing provides the compressed boot data, the data compression engine provides the compressed boot data to the boot device, and the decompressing is provided by the data compression engine.

13. The method of claim 1, wherein the compressed boot data is accessed via direct memory access.

14. The method of claim 1, wherein Huffman encoding is utilized to provide the compressed boot data.

15. The method of claim 1, wherein Lempel-Ziv encoding is utilized to provide the compressed boot data.

16. The method of claim 1, wherein a plurality of encoders are utilized to provide the compressed boot data.

17. The method of claim 1, wherein a plurality of encoders in a parallel configuration are utilized to provide the compressed boot data.

18. The system of claim 7, wherein Huffman encoding is utilized to provide the compressed boot data.

19. The system of claim 7, wherein Lempel-Ziv encoding is utilized to provide the compressed boot data.

20. The system of claim 7, wherein a plurality of encoders are utilized to provide the compressed boot data.

21. The system of claim 7, wherein a plurality of encoders in a parallel configuration are utilized to provide the compressed boot data.

22. A method comprising:
   maintaining a list of boot data used for booting a computer system;
   initializing a central processing unit of the computer system;
   preloading boot data in compressed form, based on the list of boot data, from a boot device into a cache memory prior to completion of initialization of the central processing unit;
   servicing requests for boot data from the computer system using the preloaded compressed boot data after completion of initialization of the central processing unit, wherein servicing requests comprises accessing the compressed boot data from the cache and decompressing the compressed boot data with a data compression engine and the data compression engine being operable to compress additional boot data and store the additional compressed boot data to the boot device.

23. The method of claim 22, wherein Huffman encoding is utilized by the data compression engine to compress the additional boot data.

24. The method of claim 22, wherein Lempel-Ziv is utilized by the data compression engine to compress the additional boot data.

25. The method of claim 22, wherein a plurality of encoders are utilized by the data compression engine to compress the additional boot data.

26. The method of claim 22, wherein a plurality of encoders in a parallel configuration are utilized by the data compression engine to compress the additional boot data.

27. A system comprising:
   a boot device;
   a processor;
   cache memory; and
   non-volatile memory for storing logic code for use by the processor, the logic code being used for:
      maintaining a list associated with boot data, wherein the boot data is used in booting a first system;
      preloading compressed boot data associated to the list into the cache memory prior to completion of initialization of a central processing unit of the first system; and
      servicing requests for the compressed boot data from the first system after completion of initialization of the central processing unit; and
   a data compression engine for decompressing the compressed boot data accessed from the cache memory for use in responding to the servicing requests and for compressing additional boot data and storing the additional compressed boot data to the boot device.

28. The system of claim 27, wherein Huffman encoding is utilized by the data compression engine to compress the additional boot data.

29. The system of claim 27, wherein Lempel-Ziv is utilized by the data compression engine to compress the additional boot data.

30. The system of claim 27, wherein a plurality of encoders are utilized by the data compression engine to compress the additional boot data.

31. The system of claim 27, wherein a plurality of encoders in a parallel configuration are utilized by the data compression engine to compress the additional boot data.

* * * * *